United States Patent
Fu et al.

(10) Patent No.: US 11,223,336 B2
(45) Date of Patent: Jan. 11, 2022

(54) POWER AMPLIFIER INTEGRATED CIRCUIT WITH INTEGRATED SHUNT-L CIRCUIT AT AMPLIFIER OUTPUT

(71) Applicant: NXP USA, Inc., Austin, TX (US)

(72) Inventors: Xin Fu, Chandler, AZ (US); Margaret A. Szymanowski, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/795,211

(22) Filed: Feb. 19, 2020

(65) Prior Publication Data

US 2020/0186107 A1    Jun. 11, 2020

Related U.S. Application Data

(63) Continuation-in-part of application No. 16/685,666, filed on Nov. 15, 2019.

(30) Foreign Application Priority Data

Dec. 5, 2018  (EP) ..................................... 18306616

(51) Int. Cl.
   *H03F 3/68*     (2006.01)
   *H03F 3/195*    (2006.01)
   (Continued)

(52) U.S. Cl.
   CPC .......... *H03F 3/195* (2013.01); *H03F 1/0288* (2013.01); *H03F 1/565* (2013.01); *H03F 3/211* (2013.01);
   (Continued)

(58) Field of Classification Search
   CPC .......... H03F 3/195; H03F 3/245; H03F 1/565; H03F 1/0288; H03F 3/211;
   (Continued)

(56) References Cited

U.S. PATENT DOCUMENTS

| 7,078,976 | B2 | 7/2006 | Blednov | |
| 8,228,123 | B2 * | 7/2012 | Blednov | ............... H03F 1/0288 330/295 |

(Continued)

OTHER PUBLICATIONS

EP Application No. 19306623.0; not yet published; 53 pages (Dec. 10, 2019).
(Continued)

*Primary Examiner* — Khanh V Nguyen
(74) *Attorney, Agent, or Firm* — Sherry W. Gourlay

(57) ABSTRACT

A multiple-path (e.g., Doherty) amplifier includes a semiconductor die, a radio frequency (RF) signal input terminal, a combining node structure integrally formed with the semiconductor die, first and second amplifiers (e.g., main and peaking amplifiers, or vice versa) integrally formed with the semiconductor die, and a shunt circuit electrically connected between an output of the first amplifier and a ground reference node. Inputs of the first and second amplifier are electrically coupled to the RF signal input terminal, and outputs of the first and second amplifier are electrically coupled to the combining node structure. The shunt circuit includes a shunt inductance and a shunt capacitance coupled in series between the output of the first amplifier and the ground reference node, and the shunt capacitance has a first terminal coupled to the shunt inductance, and a second terminal coupled to the ground reference node.

20 Claims, 7 Drawing Sheets

(51) Int. Cl.
  *H03F 3/24* (2006.01)
  *H03F 1/56* (2006.01)
  *H03F 1/02* (2006.01)
  *H03F 3/21* (2006.01)

(52) U.S. Cl.
  CPC ....... *H03F 3/245* (2013.01); *H03F 2200/451* (2013.01)

(58) Field of Classification Search
  CPC ......... H03F 2200/451; H03F 2200/402; H03F 3/602; H03F 3/604; H03F 1/07; H03F 3/605; H03F 3/68; H01L 2223/6655; H01L 23/66
  USPC .............................................. 330/124 R, 295
  See application file for complete search history.

(56) References Cited

U.S. PATENT DOCUMENTS

| | | | |
|---|---|---|---|
| 8,487,703 B2 | 7/2013 | Blednov | |
| 9,503,030 B2 | 11/2016 | Blednov | |
| 9,543,914 B2 | 1/2017 | Bouny | |
| 9,621,115 B1 | 4/2017 | Wu | |
| 9,774,301 B1 | 9/2017 | Maalouf et al. | |
| 10,284,146 B2 | 5/2019 | Wu et al. | |
| 10,284,147 B2 * | 5/2019 | Wu | H01L 23/538 |
| 10,594,266 B2 | 3/2020 | Krehbiel et al. | |
| 10,629,552 B2 | 4/2020 | Wu et al. | |
| 2012/0032738 A1 | 2/2012 | Uchiyama | |
| 2014/0312976 A1 | 10/2014 | Noori et al. | |
| 2015/0119107 A1 * | 4/2015 | Bouny | H04W 88/08 455/561 |
| 2018/0175802 A1 * | 6/2018 | Wu | H01L 23/66 |
| 2020/0304074 A1 * | 9/2020 | Jang | H03F 3/245 |

OTHER PUBLICATIONS

U.S. Appl. No. 16/449,994; not yet published; 48 pages (filed Jun. 24, 2019).

U.S. Appl. No. 16/563,743; not yet published; 100 pages (filed Sep. 6, 2019).

Final Office Action; U.S. Appl. No. 16/685,666; 6 pages (dated Oct. 6, 2021).

* cited by examiner

POWER AMPLIFIER INTEGRATED CIRCUIT WITH INTEGRATED SHUNT-L CIRCUIT AT AMPLIFIER OUTPUT

RELATED APPLICATION

This application is a continuation-in-part of co-pending, U.S. patent application Ser. No. 16/685,666, filed on Nov. 15, 2019, which claims priority under 35 U.S.C. § 119 to European Patent Application No. 18306616.6, filed on Dec. 5, 2018, the contents of which are incorporated by reference herein.

TECHNICAL FIELD

Embodiments of the subject matter described herein relate generally to multiple-path power amplifiers, and more particularly to Doherty power amplifiers.

BACKGROUND

A typical Doherty power amplifier (PA) includes a signal splitter to receive and divide an input radio frequency (RF) signal, a main amplifier to amplify a first signal from the splitter, a peaking amplifier to amplify a second signal from the splitter, a signal combiner to combine the amplified signals from the main and peaking amplifiers, and various impedance transformation and phase delay elements to ensure that the amplified signals are combined in phase, and that desirable impedances are present at various points within the Doherty PA. The signal splitter and signal combiner are commonly implemented on a printed circuit board (PCB) substrate, and the main and peaking amplifiers are implemented using one or more discretely-packaged devices that are physically coupled to the PCB substrate.

In modern wireless 4G and 5G communication systems, the design of RF power amplifiers becomes more complicated. Some of these systems require the PA to operate at very low power output back-off (e.g., 8 to 12 decibels (dB)) for good linearity, while limiting signal compression associated with high peak-to-average power ratio signals and achieving high power added efficiency. Doherty PA and inverted Doherty PA configurations remain popular in wireless base stations. However, high levels of integration are desired to meet the stringent requirements of modern wireless standards, including providing wide instantaneous bandwidths and high efficiency.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
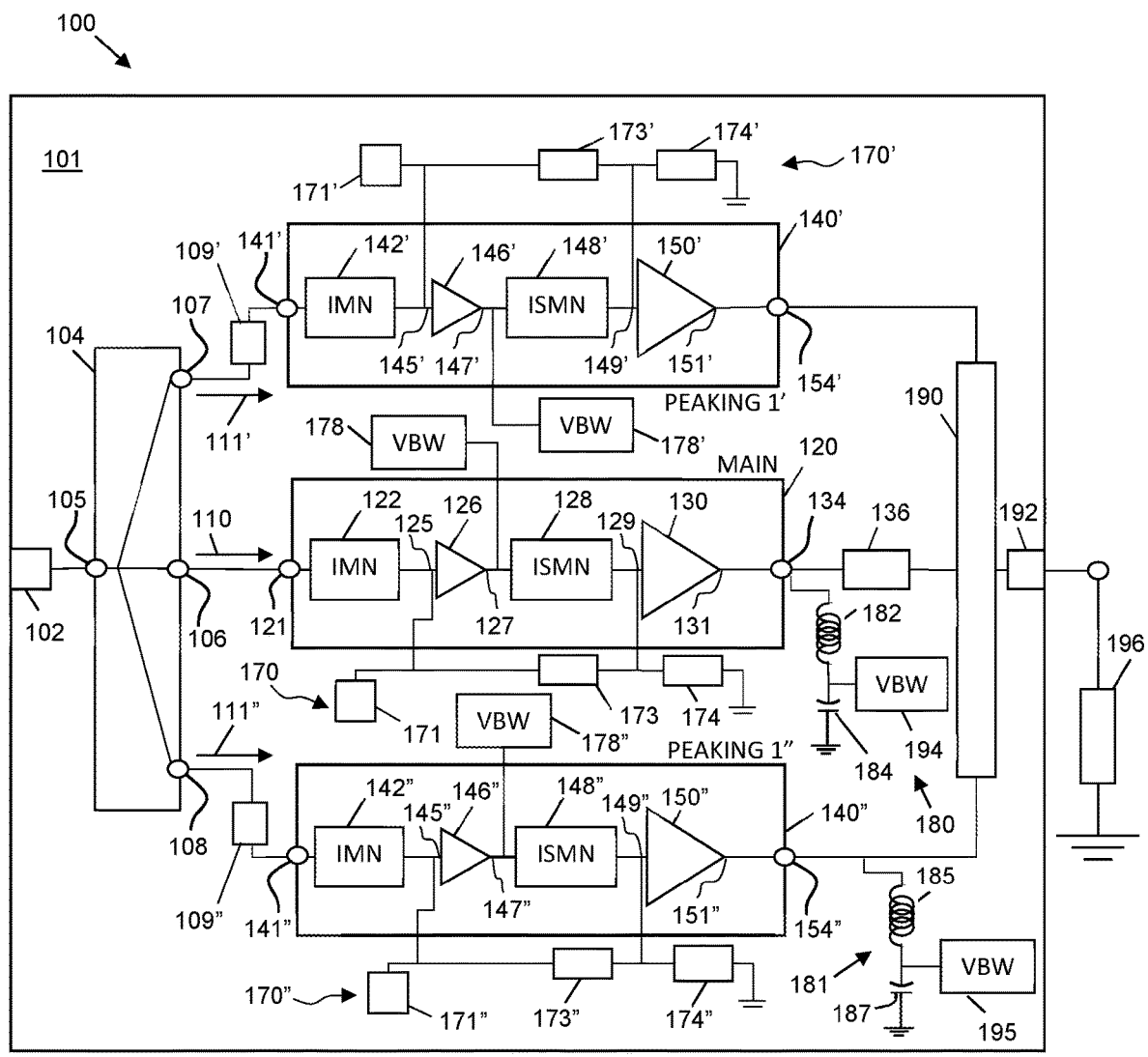
FIG. 1 is a simplified schematic of an integrated Doherty power amplifier, in accordance with an example embodiment.

Embodiments of the inventive subject matter include a monolithic (i.e., integrally formed in and/or on a single semiconductor die), multiple-path power amplifier (e.g., Doherty amplifier) with an on-die signal combiner connected to the outputs of the multiple amplifier paths. In a conventional Doherty amplifier, distinct dies used for the main and peaking amplifiers are packaged in a discrete power amplifier device, and amplified main and peaking signals are provided through separate output leads. The amplified main and peaking signals are then combined together by a Doherty combiner implemented on a printed circuit board (PCB) to which the discrete power amplifier device is coupled. In a mass production environment, various performance issues arise for conventional Doherty amplifiers due to placement tolerances for main and peaking power amplifier dies, variation in wirebond lengths and heights within the devices, and variations in the structures used to implement the Doherty combiner at the PCB level.

Embodiments of Doherty amplifiers disclosed herein may reduce such performance issues by integrating the main and peaking amplifiers and the signal combiner within a single integrated circuit die. These embodiments eliminate device-to-device production variation associated with die placement, and also may result in reductions in wirebond length and height variations. Accordingly, Doherty amplifiers with more consistent RF performance may be produced.

In addition, in various embodiments, the signal combiner is implemented with a single conductive structure that is integrally formed in the die and directly coupled to the drain terminals of the peaking transistor(s). Further, the die includes a high resistivity substrate, that enables the signal combiner to exhibit acceptably low losses. Further still, the die includes one or more integrated shunt-inductance (shunt-L) circuits coupled to the outputs of the main and/or peaking amplifiers of the integrated Doherty amplifier.

Because the signal combiner is implemented very close to the intrinsic drain(s) of the peaking amplifier(s), a 90-0 Doherty amplifier may be achieved. The 90 degree phase difference between the main and peaking amplifier outputs includes a simulated quarter wave transmission line having a CLC topology. The CLC topology includes the drain-source capacitances of the main and peaking transistors, in combination with the inductance implemented between the main amplifier output and the Doherty combining structure. The inductance is achieved, in an embodiment, using wirebonds that launch (from the main amplifier drain terminal) and land (on the signal combiner). Because the main amplifier drain terminal and the signal combiner are integrally-formed in and on the same die, the wirebond length and height can be tightly controlled, and thus the inductance value tolerance is improved when compared with conventional Doherty amplifier implementations.

The below-described and illustrated embodiments of Doherty amplifier ICs correspond to two-way Doherty amplifiers that include a main amplifier and one peaking amplifier. Although not explicitly illustrated, other embodiments may include "N-way" Doherty power amplifiers, where N>2, in which the number of peaking amplifiers equals N−1.

FIG. 1 is a simplified schematic of an integrated Doherty power amplifier 100, in accordance with an example embodiment. Doherty amplifier 100 includes an input node 102, an output node 192, a power splitter 104 (or splitter), a main amplification path 120, a peaking amplification path 111, and a combining node structure 190. A load 196 (e.g., an antenna) may be coupled to the combining node structure 190 (e.g., through an impedance transformer, not shown) to receive an amplified RF signal from amplifier 100.

Doherty power amplifier 100 is considered to be a "two-way" Doherty power amplifier, which includes one main amplifier 120 and one peaking amplifier 140. The main amplifier 120 provides amplification along a first amplification path 110, and the peaking amplifier 140 provides amplification along a second amplification path 111. In the embodiment depicted in FIG. 1, the peaking amplifier 140 is "divided", in that the amplification performed by the peaking amplifier 140 actually is performed by two, substantially identical, peaking amplifier portions 140', 140" (collectively referred to as peaking amplifier 140) along two parallel and substantially identical amplification paths 111', 111" (collectively referred to as amplification path 111). As will be explained in more detail in conjunction with FIG. 2, the peaking amplification paths 111', 111" are physically located on opposite sides of the main amplification path 110, according to an embodiment.

Although the main and peaking amplifiers 120, 140 may be of equal size (e.g., in a symmetric Doherty configuration with a 1:1 main-to-peaking size ratio), the main and peaking amplifiers 120, 140 may have unequal sizes, as well (e.g., in various asymmetric Doherty configurations). In an asymmetric two-way Doherty amplifier configuration, the peaking power amplifier 140 typically is larger than the main power amplifier 120 by some multiplier. For example, the peaking power amplifier 140 may be twice the size of the main power amplifier 120 so that the peaking power amplifier 140 has twice the current carrying capability of the main power amplifier 120. Asymmetric main-to-peaking amplifier size ratios other than a 1:2 ratio may be implemented, as well.

Power splitter 104 is configured to divide the power of an input RF signal received at input node 102 into main and peaking portions of the input signal. Because the peaking amplifier 140 is implemented using two peaking amplifier portions 140', 140", as explained above, the peaking portion of the input signal actually consists of two peaking input signals. Accordingly, power splitter 104 is configured to divide the power of the input RF signal received at input node 102 into one main portion of the input signal and two peaking portions of the input signal. The main input signal is provided to the main amplification path 120 at power splitter output 106, and the peaking input signals are provided to the peaking amplification paths 111', 111" at power splitter outputs 107 and 108. During operation in a full-power mode when both the main and peaking amplifiers 120, 140 (including 140' and 140") are supplying current to the load 196, the power splitter 104 divides the input signal power between the amplification paths 110, 111', 111".

For example, the power splitter 104 may divide the power equally, such that roughly one third of the input signal power is provided to each path 110, 111', 111". This may be the case, for example, when Doherty amplifier 100 has an asymmetric Doherty amplifier configuration in which the peaking amplifier 140 is approximately twice the size of the main amplifier 120 (i.e., the Doherty amplifier 100 has an asymmetric configuration with a 1:2 main-to-peaking size ratio). With a 1:2 main-to-peaking size ratio, the combined size of the peaking amplifier portions 140', 140" is about twice the size of the main amplifier 120, which may be achieved when each of amplifiers 120, 140', 140" is about equal in size. Alternatively, the power splitter 104 may divide the power unequally, particularly when the Doherty amplifier 100 has an asymmetric configuration other than a 1:2 main-to-peaking size ratio, or when the Doherty amplifier 100 has a symmetric configuration. In the case of a symmetric Doherty amplifier configuration, the size of the peaking amplifier 140 is about equal to the size of the main amplifier 120 (i.e., the Doherty amplifier 100 has a symmetric configuration with a 1:1 main-to-peaking size ratio). With a 1:1 main-to-peaking size ratio, the combined size of the peaking amplifier portions 140', 140" is about equal to the size of the main amplifier 120, which may be achieved when each of amplifiers 140', 140" is about half the size of amplifier 120. In that case, the power splitter 104 may divide the power so that about half of the input signal power is provided to the main amplification path 120 at power splitter output 106, and about one quarter of the input signal power is provided to each of the peaking amplification paths 111', 111" at power splitter outputs 107 and 108.

Essentially, the power splitter 104 divides an input RF signal supplied at the input node 102, and the divided signals are separately amplified along the main and peaking amplification paths 110, 111', 111". The amplified signals are then combined in phase at the combining node structure 190. It is important that phase coherency between the main and peaking amplification paths 110, 111', 111" is maintained across a frequency band of interest to ensure that the amplified main and peaking signals arrive in phase at the combining node structure 190, and thus to ensure proper Doherty amplifier operation. In the Doherty amplifier configuration depicted in FIG. 1 (i.e., a non-inverted Doherty configuration, as described below), input phase delay circuits 109', 109" are coupled between power splitter outputs 107 and 108 and peaking amplifier inputs 141', 141", respectively. According to an embodiment, each input phase delay circuit 109', 109" applies about 90 degrees of phase delay to the peaking input signals before they are provided to the peaking amplifier portions 140', 140". For example, each input phase delay circuit 109', 109" may include a quarter wave transmission line, a lumped-element delay circuit, or another suitable type of delay element with an electrical length of about 90 degrees.

Each of the main amplifier 120 and the peaking amplifier portions 140', 140" includes a single power transistor or multiple cascaded power transistors for amplifying an RF signal conducted through the amplifier 120, 140', 140". As used herein, the term "transistor" means a field effect transistor (FET) or another type of suitable transistor. For example, a "FET" may be a metal-oxide-semiconductor FET (MOSFET), a laterally-diffused MOSFET (LDMOS FET), an enhancement-mode or depletion-mode high electron mobility transistor (HEMT), or another type of FET. According to various embodiments, each of the power transistors in the main and peaking amplifier portions 120, 140', 140" may be implemented, for example, using a silicon-based FET (e.g., an LDMOS FET), a silicon-germanium (SiGe) based FET, or a III-V FET (e.g., a HEMT), such as a gallium nitride (GaN) FET (or another type of III-V transistor, including a gallium arsenide (GaAs) FET, a gallium phosphide (GaP) FET, an indium phosphide (InP) FET, or an indium antimonide (InSb) FET).

According to an embodiment, the main amplifier 120 is a two-stage amplifier, which includes a relatively low-power pre-amplifier 126 and a relatively high-power final-stage amplifier 130 connected in a cascade arrangement between main amplifier input 121 and main amplifier output 134. In the main amplifier cascade arrangement, an output 127 of the pre-amplifier 126 is electrically coupled to an input 129 of the final-stage amplifier 130. Similarly, each of the peaking amplifier portions 140', 140" is a two-stage amplifier, which includes a relatively low-power pre-amplifier 146', 146" and a relatively high-power final-stage amplifier 150', 150" connected in a cascade arrangement between a peaking amplifier input 141', 141" and a peaking amplifier output 154', 154". In each peaking amplifier cascade arrangement, an output 147', 147" of the pre-amplifier 146', 146" is electrically coupled to an input 149', 149" of the final-stage amplifier 150', 150". In other embodiments, each of the main amplifier 120 and the peaking amplifier portions 140', 140" may be a single-stage amplifier, or may include more than two, cascade-coupled amplification stages. Input and inter-stage impedance matching networks 122, 142', 142", 128, 148', 148" (IMN, ISMN) may be implemented, respectively, at the input 125, 145', 145" of each pre-amplifier 126, 146', 146" and between each pre-amplifier 126, 146', 146" and each final-stage amplifier 130, 150', 150". In each case, the matching networks 122, 142', 142", 128, 148', 148" may incrementally increase the circuit impedance toward the load impedance.

During operation of Doherty amplifier 100, the main amplifier 120 is biased to operate in class AB mode, and the peaking amplifier 140 typically is biased to operate in class C mode. In some configurations, the peaking amplifier 140 may be biased to operate in class B or deep class B modes. At low power levels, where the power of the input signal at node 102 is lower than the turn-on threshold level of peaking amplifier 140, the amplifier 100 operates in a low-power (or back-off) mode in which the main amplifier 120 is the only amplifier supplying current to the load 196. When the power of the input signal exceeds a threshold level of the peaking amplifier 140, the amplifier 100 operates in a high-power mode in which the main amplifier 120 and the peaking amplifier 140 both supply current to the load 196. At this point, the peaking amplifier 140 provides active load modulation at combining node structure 190, allowing the current of the main amplifier 120 to continue to increase linearly. As will be explained in more detail in conjunction with FIG. 2, later, gate biasing of the main and peaking amplifiers 120, 140 is performed using one or more resistor-divider gate bias circuits 170, 170', 170" (e.g., resistor-divider gate bias circuits 270, 270', 270", FIG. 2), in an embodiment, where each resistor-divider gate bias circuit 170, 170', 170" includes at least one resistor 173, 174, 173', 173", 174', 174" electrically coupled between a gate bias voltage input 171, 171', 171" and an input 125, 129, 145', 145", 149', 149" (e.g., a gate terminal) of each amplifier 126, 130, 146', 146", 150', 150".

According to an embodiment, an integrated shunt inductance (shunt-L) circuit 180 is coupled between the output 134 of the main amplifier 120 and a ground reference (or ground reference node), in an embodiment. In alternate embodiments, one or more integrated shunt-L circuit(s) 181 also or alternatively may be coupled between the output(s) 154', 154" of the peaking amplifier(s) 140', 140" and the ground reference. Essentially, the shunt-L circuit(s) 180, 181 are configured to compensate for the drain-source capacitance at the outputs 131, 151', 151" of the main and peaking final-stage amplifiers 130, 150. In an embodiment, each shunt-L circuit 180, 181 includes an inductance 182, 185 and a capacitance 184, 187 coupled in series between the output 134, 154 of the main amplifier 120 and/or the peaking amplifier 140', 140" and the ground reference.

In addition, embodiments of the inventive subject matter may include one or more video bandwidth (VBW) circuits 178, 178', 178", coupled between each amplification path 110, 111', 111" and a ground reference. In some specific embodiments, a VBW circuit 194, 195 also or alternatively is coupled to a node (e.g., an "RF cold point" node, or some other node) between the inductance 182, 185 and the capacitance 184, 187 of the shunt-L circuit(s) 180, 181. As used herein, an "RF cold point" node is a conductive node that may function as a virtual ground reference voltage for RF electrical signals.

The VBW circuits 178, 178', 178", 194, 195 are configured to improve the low frequency resonance (LFR) of amplifier 100 caused by the interaction between various circuitry and structures of the amplifier 100 by presenting a low impedance at envelope frequencies and/or a high impedance at RF frequencies. The VBW circuits 178, 178', 178", 194, 195 essentially may be considered to be "invisible" from an RF matching standpoint, as they primarily effect the impedance at envelope frequencies (i.e., VBW circuits 178, 178', 178", 194, 195 provide terminations for signal energy at the envelope frequencies of amplifier 100). The VBW circuits 178, 178', 178", 194, 195 may have any of a number of configurations. In some embodiments, each VBW circuit 178, 178', 178", 194, 195 includes a series circuit of a resistor, an inductor, and a capacitor coupled between the ground reference and a point along an amplification path 110, 111', 111" or an RF cold point node in a shunt-L circuit 180, 181. The resistor, inductor, and/or capacitor of some or all of the VBW circuits 178, 178', 178", 194, 195 may be integrated with die 101 in some embodiments, or the resistor, inductor, and/or capacitor may be implemented off chip (e.g., in a device in which die 101 is packaged, or on a PCB to which die 101 is coupled) in various other embodiments.

For example, in FIG. 1, each VBW circuit 178, 178', 178" is coupled between the output 127, 147', 147" of a pre-amplifier 126, 146', 146" and the ground reference. In contrast, each VBW circuit 194, 195 is coupled between the output 131, 151', 151" of a final-stage amplifier 130, 150', 150" and a ground reference. In still other embodiments, a VBW circuit (not illustrated) may be coupled between the input 125, 145', 145" of a pre-amplifier 126, 146', 146" and the ground reference. Multiple VBW circuits may be coupled along multiple points of each amplification path 110, 111', 111", as well.

Doherty amplifier 100 has a "non-inverted" load network configuration. In the non-inverted configuration, the input circuit is configured so that the input signals supplied to the peaking amplifier portions 140', 140" are delayed by 90 degrees with respect to the input signal supplied to the main amplifier 120 at the center frequency of operation, $f_O$, of the amplifier 100. To ensure that the main and peaking input RF signals arrive at the main and peaking amplifiers 120, 140, 140" with about 90 degrees of phase difference, as is fundamental to proper Doherty amplifier operation, input phase delay circuits 109', 109" each apply about 90 degrees of phase delay to the peaking input signals before they are provided to the peaking amplifier portions 140', 140", as described above.

The 90 degree phase delay difference between the main and peaking amplification paths 110, 111', 111" at the inputs of amplifiers 120, 140', 140", compensates for an output phase delay circuit 136, which is configured to apply about a 90 degree phase delay to the signal between the output of main amplifier 120 and the combining node structure 190. The various phase delay circuits 109', 109", 136 ensure that the amplified signals arrive in phase at the combining node structure 190.

Alternate embodiments of Doherty amplifiers may have an "inverted" load network configuration. In such a configuration, the amplifier is configured so that an input signal supplied to the main amplifier 120 is delayed by about 90 degrees with respect to the input signals supplied to the peaking amplifier portions 140', 140" at the center frequency of operation, $f_O$, of the amplifier 100, and output phase delay circuits are configured to apply about a 90 degree phase delay to the signals between the outputs of the peaking amplifier portions 140', 140" and the combining node structure 190.

Doherty amplifier 100 is "integrated," as that term is used herein, because at least the main amplifier 120 (e.g., including the pre-amplifier 126 and the final-stage amplifier 130), the peaking amplifier 140 (including the pre-amplifiers 146', 146" and the final-stage amplifiers 150', 150"), the shunt-L circuit(s) 180, 181, and the combining node structure 190 are integrally—and monolithically—formed in one single IC die 101 (e.g., die 201, 401, 501, 601, 701, 801, 901, FIGS. 2-9), which may be referred to herein as an "integrated Doherty amplifier die." According to an embodiment, all or portions of the input and inter-stage impedance matching networks 122, 142', 142", 128, 148', 148" also may be integrally- and monolithically-formed in the same IC die (e.g., die 201, 401, 501, 601, 701, 801, 901, FIGS. 2-9). Alternatively, all or portion of the input impedance matching networks 122, 142', 142" may be implemented in one or more components that are distinct from the IC die that includes the main and peaking amplifiers 120, 140. According to a further embodiment, the input node 102, power splitter 104, and output node 192 also are integrally- and monolithically-formed in the same IC die (e.g., die 201, 401, 501, 601, 701, 801, 901, FIGS. 2-9) as the main and peaking amplifiers 120, 140 and the combining node structure 190. In an alternate embodiment, the input node 102 and power splitter 104 may be implemented in one or more components that are distinct from the IC die that includes the main and peaking amplifiers 120, 140 and the combining node structure 190. According to another further embodiment, the resistor-divider bias circuits 170, 170', 170" also are integrally- and monolithically-formed in the same IC die (e.g., die 201, 401, 501, 601, 701, 801, 901, FIGS. 2-9) as the main and peaking amplifiers 120, 140 and the combining node structure 190, although biasing may be performed by non-integrated circuits and structures in other embodiments. According to yet another further embodiment, the VBW circuits 178, 178', 178", 194, 195 also are integrally- and monolithically-formed in the same IC die (e.g., die 201, 401, 501, 601, 701, 801, 901, FIGS. 2-9) as the main and peaking amplifiers 120, 140 and the combining node structure 190, although the VBW circuits 178, 178', 178", 194, 195 may be implemented using non-integrated circuits and structures in other embodiments.

Figure 2:
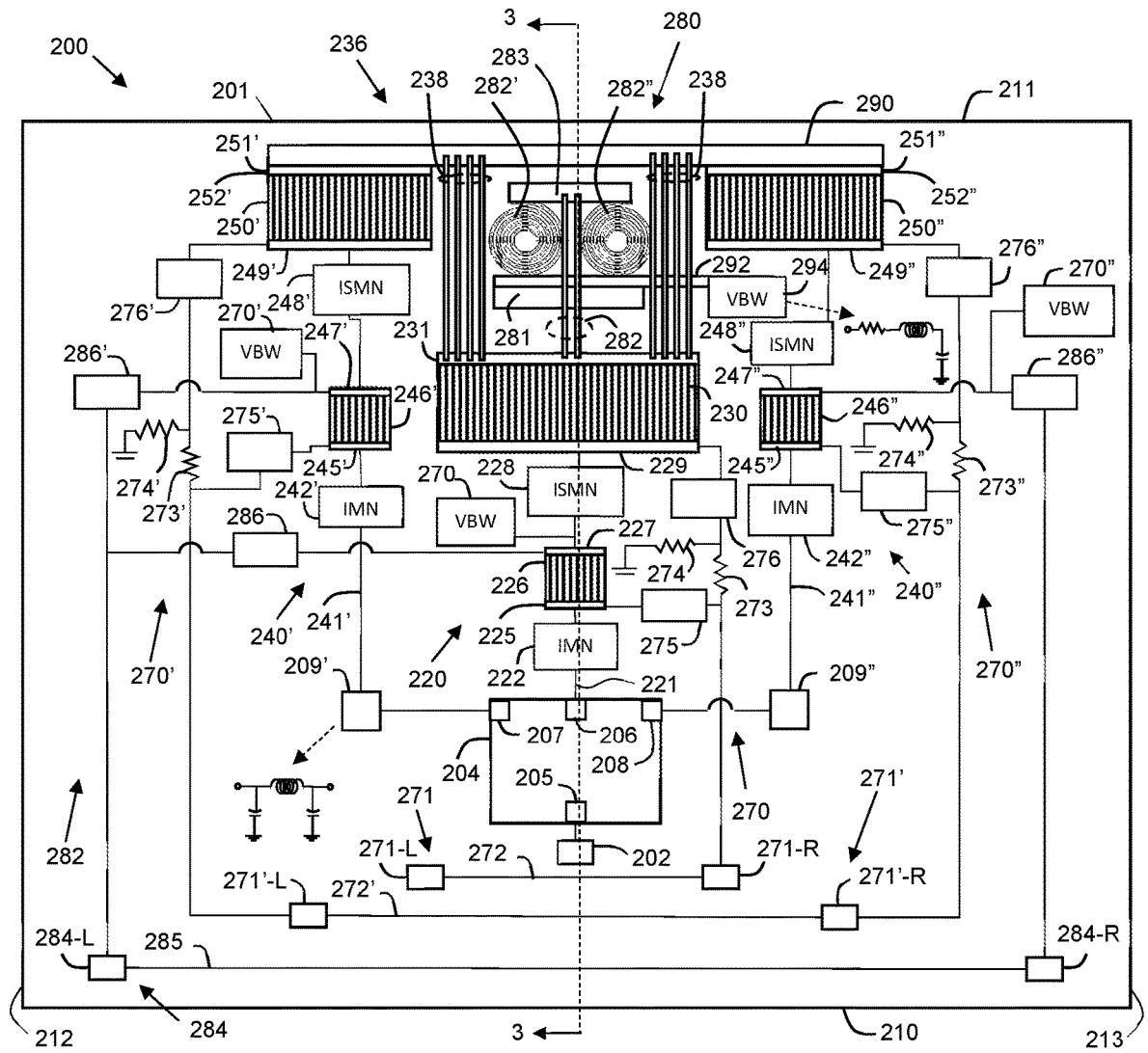
FIG. 2 is a top view of a Doherty power amplifier integrated circuit (IC), in accordance with an example embodiment.

FIG. 2 is a top view of a Doherty power amplifier IC 200 (or "Doherty IC"), in accordance with an example embodiment. For enhanced understanding, FIG. 2 should be viewed simultaneously with FIG. 3, which is a side, cross-sectional view of the Doherty IC 200 of FIG. 2 along line 3-3. As used herein, the terms "integrated circuit die" and "IC die" mean a single, distinct semiconductor die (or semiconductor substrate) within which one or more circuit components (e.g., transistors, passive devices, wirebonds, and so on) are integrally-formed and/or directly physically connected to produce a monolithic structure.

Doherty IC 200 includes substantially an entire Doherty amplifier (e.g., Doherty amplifier 100, FIG. 1) integrally- and monolithically-formed in and on a single semiconductor die 201, where the semiconductor die has a substantially rectangular periphery defined by opposed input and output sides 210, 211 (e.g., bottom and top sides in the orientation of FIG. 2) and opposed left and right sides 212, 213 that extend between the input and output sides. In the specific embodiment illustrated in FIG. 2, Doherty amplifier IC 200 includes the following circuitry integrally- and monolithically-formed in and on semiconductor die 201: an input terminal 202 (e.g., input node 102, FIG. 1), a power splitter 204 (e.g., power splitter 104, FIG. 1), input phase delay circuits 209', 209" (e.g., input phase delay circuits 109', 109", FIG. 1), a two-stage main amplifier 220 (e.g., main amplifier 120, FIG. 1), a divided peaking amplifier consisting of first and second peaking amplifier portions 240', 240" (e.g., peaking amplifier portions 140', 140", FIG. 1), an output phase delay circuit 236 (e.g., output phase delay circuit 136, FIG. 1), a combining node structure 290 (e.g., combining node structure 190, FIG. 1), an integrated shunt-L circuit 280 (e.g., shunt-L circuit 180, FIG. 1), resistor-divider bias circuits 270, 270', 270" (e.g., resistor-divider bias circuits 170, 170', 170", FIG. 1), and VBW circuits 278, 278', 278", 294 (e.g., VBW circuits 178, 178', 178", 194, FIG. 1). In various alternate embodiments, one or more of the input terminal 202, power splitter 204, input phase delay circuits 209', 209", resistor-divider gate bias circuits 270, 270', 270", and/or VBW circuits 278, 278', 278", 294 may be implemented using circuitry and/or on substrates that are physically distinct from the semiconductor die 201 in and on which the remaining portions of the Doherty amplifier are formed.

Figure 3:
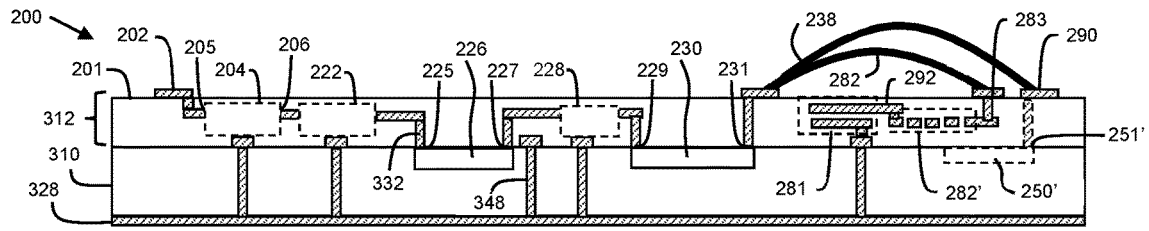
FIG. 3 is a side, cross-sectional view of the Doherty amplifier IC of FIG. 2 along line 3-3, in accordance with an example embodiment.

As seen most clearly in FIG. 3, the semiconductor die 201 includes a base semiconductor substrate 310 and a plurality of build-up layers 312 over a top surface of the base semiconductor substrate 310. In a particular example embodiment, the base semiconductor substrate 310 is a high-resistivity silicon substrate (e.g., a silicon substrate having bulk resistivity in a range of about 1000 ohm-centimeter (cm) to about 100,000 ohm-cm or greater). Alternatively, the base semiconductor substrate 310 may be a semi-insulating gallium arsenide (GaAs) substrate (e.g., a GaAs substrate having bulk resistivity up to $10^8$ ohm-cm), or another suitable high-resistivity substrate. In still other alternate embodiments, the base semiconductor substrate 310 may be any of multiple variants of a GaN substrate or other III-V semiconductor substrates.

Figure 6:
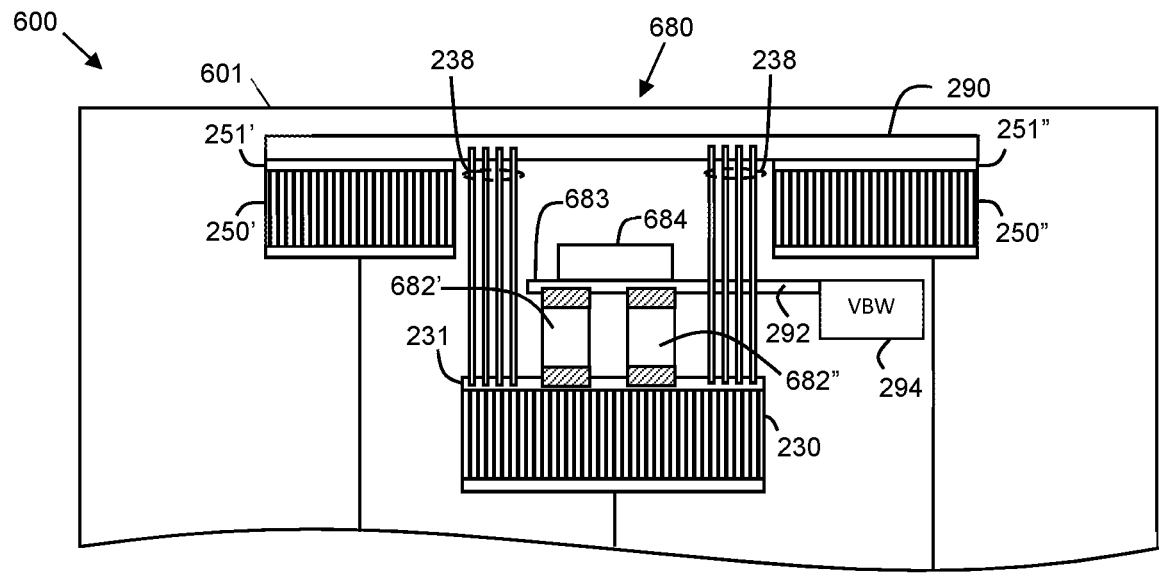
FIG. 6 is a top view of a portion of a Doherty power amplifier IC, in accordance with yet another example embodiment.
Figure 7:
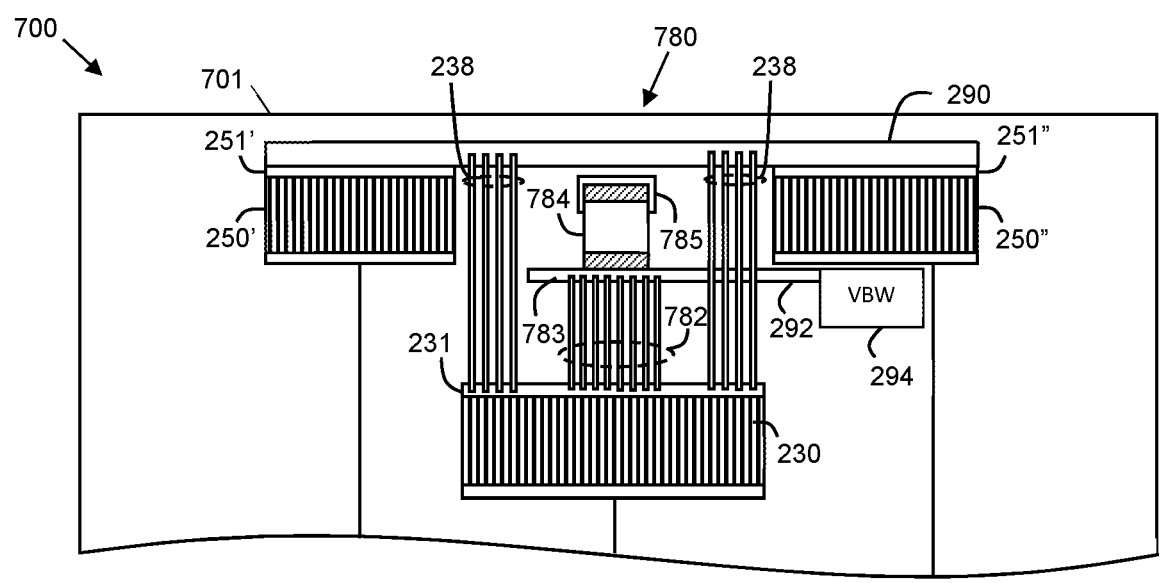
FIG. 7 is a top view of a portion of a Doherty power amplifier IC, in accordance with yet another example embodiment.

The plurality of build-up layers 312 may include, for example, a plurality of interleaved dielectric layers, patterned conductive layers, and other conductive structures (e.g., conductive polysilicon structures). Portions of different patterned conductive layers and structures are electrically coupled with conductive vias (e.g., via 332). Further, conductive through substrate vias (TSVs) (e.g., TSV 348) may provide conductive paths between the top and bottom surfaces of the base semiconductor substrate 310. The TSVs may or may not be lined with dielectric material to insulate the TSVs from the base semiconductor substrate 310. According to an embodiment, a conductive layer 328 on the bottom surface of the base semiconductor substrate 310 functions as a ground node for the Doherty IC 200. Although not shown in FIG. 3, but as indicated in FIG. 6, when the Doherty IC 200 ultimately is packaged, the conductive layer 328 may be physically and electrically coupled to a ground node of a package substrate (e.g., flange 630, FIG. 6). Accordingly, when a component of Doherty IC 200 is said to be coupled to a "ground reference node," the component may be electrically coupled to the conductive layer 328, in at least some embodiments. Alternatively, the component may be coupled to ground in some other manner.

In the below description of the Doherty IC 200, reference will be made to various circuits that include capacitors, inductors, and/or resistors. The capacitors may be, for example, integrated metal-insulator-metal (MIM) capacitors (e.g., capacitors 239, 283, FIGS. 2, 3) formed within the build-up layers 312, and/or small chip capacitors (e.g., discrete capacitors 784, 884, FIGS. 7, 8) coupled to the top surface of the die 201, in various embodiments. The resistors may be, for example, integrated resistors (e.g., formed from polysilicon within the build-up layers 312), or small discrete resistors coupled to the top surface of the die 201. The inductors may be integrated spiral inductors (e.g., inductors 282', 282", 582', 582", FIGS. 2, 3, 5) formed from patterned conductive layers and vias within the build-up layers 312), or they may be discrete inductors (e.g., inductors 682', 682", 882', 882", FIGS. 6, 8) or inductances formed from wirebonds (e.g., wirebonds 238, 282, 482, 782, 982, 985, FIGS. 2-9) or other inductive components.

In the embodiment of FIGS. 2 and 3, each of the main amplifier 220 and the peaking amplifier portions 240', 240" include a cascade arrangement of two power transistors, including a relatively low-power pre-amplifier transistor 226, 246', 246" (e.g., pre-amplifiers 126, 146', 146", FIG. 1) and a relatively high-power final-stage amplifier transistor 230, 250', 250" (e.g., final-stage amplifiers 130, 150', 150", FIG. 1). The description herein refers to each transistor as including a control terminal and two current-conducting terminals. For example, using terminology associated with FETs, a "control terminal" refers to a gate terminal of a transistor, and first and second current-conducting terminals refer to drain and source terminals (or vice versa) of a transistor. Although the below description may use terminology commonly used in conjunction with FET devices, the various embodiments are not limited to implementations the utilize FET devices, and instead are meant to apply also to implementations that utilize bipolar junction transistors (BJT) devices or other suitable types of transistors.

Each transistor 226, 246', 246", 230, 250', 250" includes a gate terminal 225, 229, 245', 245", 249', 249" (or control terminal), a drain terminal 227, 231, 247', 247", 251', 251" (or first current-carrying terminal), and a source terminal (or second current-carrying terminal), not numbered. In a specific embodiment, each transistor 226, 246', 246", 230, 250', 250" is an LDMOS FET, which includes an active area disposed between gate and drain terminals. Each active area includes a plurality of elongated, parallel-aligned, and interdigitated drain regions and source regions, where each drain region and each source region is a doped semiconductor region formed in the base semiconductor substrate 310. Due to their elongated shapes, each set of adjacent drain and source regions, along with an associated gate structure, may be referred to as a "transistor finger," and each transistor 226, 246', 246", 230, 250', 250" includes a plurality of parallel transistor fingers within the active area of the transistor (indicated with vertical lines in FIGS. 2 and 4-9).

A variably-conductive channel (and, in some embodiments, a drain drift region) is present between adjacent source and drain regions. Conductive (e.g., polysilicon or metal) gate structures formed over the base semiconductor substrate 310 are coupled to and extend from each gate terminal 225, 229, 245', 245", 249', 249" over and along the channel regions. Similarly, additional conductive (e.g., polysilicon) drain structures formed over the base semiconductor substrate 310 are coupled to and extend from each drain terminal 227, 231, 247', 247", 251', 251" over and along the drain regions. The source regions are electrically coupled to conductive (e.g., polysilicon or metal) source contacts, which in turn are coupled to conductive TSVs (e.g., TSV 348, FIG. 3) that extend through the base semiconductor substrate 310 to connect with conductive layer 328 on the bottom surface of the base semiconductor substrate 310. Voltages applied to the gate terminals 225, 229, 245', 245", 249', 249" during operation modulate the conductivity of the variably-conductive channels, thus enabling current flow between source and drain regions (or ultimately between conductive layer 328 and each drain terminal 227, 231, 247', 247", 251', 251").

The circuitry integrated within and coupled to Doherty IC 200 will now be described in more detail. Referring again to FIG. 2, the input terminal 202 (e.g., input node 102, FIG. 1), which is configured to receive an input RF signal for amplification, is electrically connected to a splitter input 205 (e.g., input 105, FIG. 1) of power splitter 204 through a conductive path implemented in the build-up layers 312 of the Doherty IC 200. Input terminal 202 may include, for example, a conductive bondpad, which is exposed at the top surface of the die 201, and which is configured for attachment of one or more wirebonds (e.g., wirebond 1050, FIG. 10). Alternatively, die 201 may be a flip-chip die or the input terminal may be exposed at the bottom surface of the die 201, in which case the input terminal 202 may consist of a conductive land or other type of connection. These alternate configurations also may apply to the other terminals (e.g., terminals 271-L, 271-R, 271'-L, 271'-R, 284-L, and 284-R) of the Doherty IC 200.

The power splitter 204 (e.g., power splitter 104, FIG. 1) is configured to divide the power of an input RF signal received at input terminal 205 into main and peaking portions of the input signal. As described in conjunction with FIG. 1, because the peaking amplifier is implemented using two peaking amplifier portions 240', 240", power splitter 204 is configured to divide the power of the input RF signal received at input terminal 202 into one main portion of the input signal and two peaking portions of the input signal. The main input signal is produced at power splitter output 206 (e.g., output 106, FIG. 1), and the peaking input signals are produced at power splitter outputs 207 and 208 (e.g., outputs 107 and 108, FIG. 1). As also discussed previously, the power splitter 204 may divide the power equally or unequally, depending on the relative sizes of the main amplifier 220 and the peaking amplifier portions 240', 240".

In the embodiment of FIG. 2, the sizes of the main amplifier 220 and the peaking amplifier portions 240', 240" are approximately equal (i.e., the three amplifiers 220, 240', 240" have a 1:1:1 size relationship, and the Doherty amplifier is an asymmetric amplifier with a 1:2 main-to-peaking ratio), and thus the power splitter 204 divides the input RF signal so that roughly one third of the input signal power is produced at each power splitter output 206-208. In other embodiments, the sizes of the main amplifier 220 and the peaking amplifier portions 240', 240" may be unequal, in which case the power splitter 204 may divide the power of the RF input signal into unequal portions.

Input terminal 205 has a 50 ohm input impedance, in an embodiment, although the input impedance may be less or greater than 50 ohms, as well. According to an embodiment, the power splitter 204 has a Wilkinson-based design, which essentially divides the power of the input signal received at input 205 into three signals with equal phase at outputs 206-208.

According to an embodiment, power splitter 204 is formed from passive components that are integrally-formed in and/or coupled to Doherty IC 200. In a more specific embodiment, power splitter 204 is a three-branch splitter, where each splitter branch has a multiple-section CLC (capacitor-inductor-capacitor) topology. Power splitter 204 may provide an advantage over conventional power splitters, in that the multiple-section topology of power splitter 204 may have a more broadband response than a conventional one-section power splitter. Other alternate embodiments that include a single peaking amplifier may include only two branches (e.g., one branch for the main amplifier and one branch for the single peaking amplifier). Still other alternate embodiments that include more than two peaking amplifier portions (or more than one divided peaking amplifier) may include more than three branches (e.g., one branch for the main amplifier and one branch for each peaking amplifier or peaking amplifier portion).

Output 206 of power splitter 204 is electrically connected to the input 221 of the main amplifier 220 through a conductive path implemented in the build-up layers 312 of the Doherty IC 200. According to an embodiment, outputs 207, 208 of power splitter 204 are electrically connected to the inputs 241', 241" of the peaking amplifier portions 240', 240" through input phase delay circuits 209', 209" (e.g., input phase delay circuits 109', 109", FIG. 1) and additional conductive paths implemented in the build-up layers 312 of the Doherty IC 200. The input phase delay circuits 209', 209" are configured to ensure that the peaking input signals at the inputs 241', 241" to the peaking amplifier portions 240', 240" have about 90 degrees of phase difference from the main input signal at the input 221 to the main amplifier 220. According to an embodiment, each input phase delay circuit 209', 209" is implemented with integrated components, which as indicated by the circuit schematic next to circuit 209', may include a pi-configured phase delay circuit. For example, each phase delay circuit 209', 209" may include an integrated inductor with a first terminal coupled to an output 207, 208 of splitter 204, and a second terminal coupled to an input 241', 241" to a respective peaking amplifier portions 240', 240", along with integrated shunt capacitors coupled between each inductor terminal and the ground reference. In an alternate embodiment, the input phase delay circuits 209', 209" could be implemented using transmission lines (or wirebonds) having a suitable electrical length (e.g., about 90 degrees or a lesser amount that is sufficient to produce the desired phase delay at inputs 241', 241"), or using some other delay circuit structure or configuration.

Each of the main amplifier 220 and the peaking amplifier portions 240', 240" may have a substantially similar configuration, in an embodiment. According to an embodiment, each amplifier 220, 240', 240" is a two-stage amplifier, which includes a relatively low-power pre-amplifier 226, 246', 246" (or pre-amplifier FET) and a relatively high-power final-stage amplifier 230, 250', 250" (or final-stage amplifier FET) connected in a cascade arrangement between an amplifier input 221, 241', 241" and a combining node structure 290.

In the main amplifier 220, an input 221 of the amplifier 220 is coupled through an input impedance matching network 222 (e.g., IMN 122, FIG. 1) to an input terminal 225 (e.g., gate terminal) of pre-amplifier FET 226, an output 227 (e.g., drain terminal) of the pre-amplifier FET 226 is electrically coupled through an inter-stage impedance matching network 228 (e.g., ISMN 128, FIG. 1) to an input terminal 229 (e.g., gate terminal) of final-stage amplifier FET 230. Similarly, in each of the peaking amplifier portions 240', 240", an input 241', 241" of the amplifier 240', 240" is coupled through an input impedance matching network 242', 242" (e.g., IMNs 142', 142", FIG. 1) to an input terminal 245', 245" (e.g., gate terminal) of pre-amplifier FET 246', 246", an output 247', 247" (e.g., drain terminal) of the pre-amplifier FET 246', 246" is electrically coupled through an inter-stage impedance matching network 248', 248" (e.g., ISMN 148', 148", FIG. 1) to an input terminal 249', 249" (e.g., gate terminal) of final-stage amplifier FET 250', 250". The source terminals of each of FETs 226, 230, 246', 246", 250', 250" are electrically coupled to a ground reference (e.g., using TSVs through the base semiconductor substrate 310 to a bottom conductive layer 328, FIG. 3).

Each pre-amplifier FET 226, 246', 246" may be equal in size, in an embodiment, and may configured to apply a gain to a respective input RF signal in a range of about 15 decibels (dB) to about 25 dB when the Doherty IC 200 is operating in a high-power mode (e.g., close to compression), although only pre-amplifier FET 226 provides gain to its input signal when the Doherty IC 200 is operating in a low-power mode. The final-stage amplifier FETs 230, 250', 250" are significantly larger than the pre-amplifier FETs 226, 246', 246" (e.g., at least twice as large to apply at least twice the gain). Each final-stage amplifier FET 230, 250', 250" also may be equal in size, in an embodiment, and may be configured to apply a gain to a respective input RF signal in a range of about 15 dB to about 25 dB when the Doherty IC 200 is operating in a high-power mode (e.g., close to compression), although only final-stage amplifier FET 230 provides gain to its input signal when the Doherty IC 200 is operating in a low-power mode.

According to an embodiment, gate bias voltages for each of the FETs 226, 230, 246', 246", 250', 250" are provided through resistor-divider gate bias circuits 270, 270', 270" (e.g., resistor-divider gate bias circuits 170, 170', 170", FIG. 1). As indicated previously, for proper operation of Doherty amplifier IC 200, the main amplifier 220 is biased to operate in class AB mode, and the peaking amplifier portions 240', 240" typically are biased to operate in class C mode. In some configurations, the peaking amplifier portions 240', 240" may be biased to operate in class B or deep class B modes. Because the main amplifier 220 is biased differently from the peaking amplifier portions 240', 240", the main amplifier resistor-divider gate bias circuit 270 is distinct from (and not electrically connected to) the peaking amplifier resistor-divider gate bias circuits 270', 270". However, since the peaking amplifier portions 240', 240" are biased the same as each other, the peaking amplifier resistor-divider gate bias circuits 270', 270" may be identical and electrically connected together, as is shown in the embodiment of FIG. 2.

In the illustrated embodiment, the main amplifier resistor-divider gate bias circuit 270 includes a multi-point input terminal 271, resistors 273, 274, and RF isolation circuits 275, 276. Input terminal 271 includes electrically connected first and second (e.g., left (L) and right (R)) terminals 271-L and 271-R, in an embodiment. More specifically, the corresponding pair of terminals 271-L and 271-R are electrically connected together through a conductive path 272. The conductive path 272 may include one or more conductive traces formed from portions of one or more conductive layers of the build-up layers (e.g., build-up layers 312, FIG. 3), and that extend between the terminals 271-L, 271-R across a device bisection line (e.g., device bisection line 1001, FIG. 10). The conductive path 272 also may include conductive vias in the build-up structure to interconnect the terminals 271-L, 271-R and the one or more conductive traces. According to an embodiment, the conductive path 272 is a relatively low-resistance conductive path that is devoid of discrete passive or active circuit components (e.g., inductors, resistors, capacitors, transistors, and so on). The conductive path 272 extends across at least 10 percent of a width (horizontal dimension in FIG. 2) of the device 200, in one embodiment, across at least 25 percent of the device width, in another embodiment, and across at least 50 percent of the device width, in yet another embodiment. Each of terminals 271-L and 271-R may include a conductive bondpad that is exposed at the top surface of the die 201, and which is configured for attachment of one or more wirebonds (e.g., wirebond 1051 and/or 1052, FIG. 10). As will be better understood later in conjunction with the description of FIG. 10, the inclusion of electrically-connected left and right input terminals 271-L and 271-R enables a main amplifier input bias voltage to be supplied through either or both of two main amplifier bias leads (e.g., lead 1011 and/or lead 1012, FIG. 10) that are located to the left and to the right, respectively, of the device bisection line (e.g., device bisection line 1001, FIG. 10). This feature provides increased design flexibility for packaging Doherty amplifier IC 200 and/or for configuring a printed circuit board (PCB) (e.g., PCB 1110, FIG. 11) on which such a packaged Doherty amplifier IC is coupled. In an alternate embodiment, the input terminal 271 may include only a single conductive bond pad.

Resistors 273, 274 are electrically connected in series between input terminal 271 and a ground reference. The first resistor 273 has a first terminal electrically coupled to the input terminal 271 and to the gate terminal 225 of the pre-amplifier FET 226. A node between input terminal 271 and resistor 273 is electrically connected to the gate terminal 225 of the pre-amplifier FET 226, and an intermediate node (between resistors 273, 274) is electrically connected to the gate terminal 229 of final-state amplifier FET 230. The resistance values of resistors 273, 274 are selected to divide the main pre-amplifier gate bias DC voltage supplied at input terminal 271 (or at gate terminal 225) into fractions, so that a desired DC bias voltage is provided at gate terminal 229. For example, resistors 273, 274 may have equal or unequal resistance values in a range of about 500 ohms to about 10,000 ohms, although resistors 273, 274 may have lower or higher resistance values, as well.

To ensure that a significant amount of RF power is not lost through the bias circuit 270, main amplifier 220 is de-coupled (or isolated) from the bias circuit 270 with RF isolation circuits 275, 276. More specifically, RF isolation circuit 275 is electrically coupled between the input terminal 271 and gate terminal 225, and RF isolation circuit 276 is electrically coupled between resistor 273 and gate terminal 229. According to an embodiment, each RF isolation circuit 275, 276 includes an integrated, lumped-element equivalent of a quarter wave (lambda/4) transmission line, with a reactive component that resonates at the center frequency of operation of the amplifier 200. Ideally, using this configuration, the bias circuit 270 emulates infinite impedance at frequencies near the center frequency of operation, thus isolating the bias circuit 270 at those frequencies.

The peaking amplifier resistor-divider gate bias circuits 270', 270" each include a multi-point input terminal 271', resistors 273', 273", 274', 274" and RF isolation circuits 275', 275", 276', 276". Input terminal 271' includes electrically connected first and second (e.g., left (L) and right (R)) terminals 271'-L and 271'-R, in an embodiment. As mentioned above, since the peaking amplifier portions 240', 240" may be biased the same, input terminals 271'-L and 271'-R may be electrically connected, and to provide packaging and device mounting flexibility, they may be located to the left and to the right, respectively, of the device bisection line (e.g., device bisection line 1001, FIG. 10). More specifically, the corresponding pair of terminals 271'-L and 271'-R are electrically connected together through a conductive path 272'. The conductive path 272' may include one or more conductive traces formed from portions of one or more conductive layers of the build-up layers (e.g., build-up layers 312, FIG. 3), and that extend between the terminals 271'-L and 271'-R across a device bisection line (e.g., device bisection line 1001, FIG. 10). The conductive path 272' also may include conductive vias in the build-up structure to interconnect the terminals 271'-L and 271'-R and the one or more conductive traces. According to an embodiment, the conductive path 272' is a relatively low-resistance conductive path that is devoid of discrete passive or active circuit components (e.g., inductors, resistors, capacitors, transistors, and so on). The conductive path 272' extends across at least 10 percent of the device width, in one embodiment, across at least 25 percent of the device width, in another embodiment, and across at least 50 percent of the device width, in yet another embodiment. Again, each of input terminals 271'-L and 271'-R may include a conductive bondpad that is exposed at the top surface of the die 201, and which is configured for attachment of one or more wirebonds (e.g., wirebond 1053 and/or 1054, FIG. 10). In alternate embodiments, the input terminals 271'-L and 271'-R may be electrically isolated from each other, or a single input terminal may replace the two input terminals 271'-L and 271'-R.

Resistors 273', 274' are electrically connected in series between input terminal 271'-L and a ground reference. The first resistor 273' has a first terminal electrically coupled to the input terminal 271' and to the gate terminal 245' of the pre-amplifier FET 246'. A node between input terminal 271'-L and resistor 273' is electrically connected to the gate terminal 245' of the pre-amplifier FET 246', and an intermediate node (between resistors 273', 274') is electrically connected to the gate terminal 249' of final-stage amplifier FET 250'. Similarly, resistors 273", 274" are electrically connected in series between input terminal 271'-R and a ground reference. The first resistor 273" has a first terminal electrically coupled to the input terminal 271' and to the gate terminal 245" of the pre-amplifier FET 246". A node between input terminal 271'-R and resistor 273" is electrically connected to the gate terminal 245" of the pre-amplifier FET 246", and an intermediate node (between resistors 273", 274") is electrically connected to the gate terminal 249" of final-stage amplifier FET 250". The resistance values of resistors 273', 273", 274', 274" are selected to divide the peaking pre-amplifier gate bias DC voltage supplied at input terminal 271'-L, 271'-R (or at gate terminals 245', 245") into fractions, so that a desired DC bias voltage is provided at gate terminals 249', 249". For example, resistors 273', 274' and 273", 274" may have equal or unequal resistance values in a range of about 1000 ohms to about 10,000 ohms, although resistors 273', 273", 274', 274" may have lower or higher resistance values, as well.

Again, to ensure that a significant amount of RF power is not lost through the bias circuits 270', 270", peaking amplifier portions 240', 240" are de-coupled (or isolated) from the bias circuits 270', 270" with RF isolation circuits 275', 275", 276', 276". More specifically, RF isolation circuits 275', 275" are electrically coupled between the input terminal 271' and gate terminals 245', 245", and RF isolation circuits 276', 276" are electrically coupled between resistors 273', 273" and gate terminals 249', 249". Again, each RF isolation circuit 275', 275", 276', 276" may include an integrated, lumped-element equivalent of a quarter wave (lambda/4) transmission line, with a reactive component that resonates at the center frequency of operation.

In addition to the gate bias circuits 270, 270', 270", Doherty amplifier IC 200 also may include one or more drain bias circuits 282. According to an embodiment, a drain bias circuit 282 includes a multi-point input terminal 284 and RF isolation circuits 286, 286', 286". Input terminal 284 includes electrically connected left and right terminals 284-L and 284-R on opposite sides of a device bisection line (e.g., device bisection line 1001, FIG. 10), in an embodiment. More specifically, the corresponding pair of terminals 284-L and 284-R are electrically connected together through a conductive path 285. The conductive path 285 may include one or more conductive traces formed from portions of one or more conductive layers of the build-up layers (e.g., build-up layers 312, FIG. 3), and that extend between the terminals 284-L, 284-R across a device bisection line (e.g., device bisection line 1001, FIG. 10). The conductive path 285 also may include conductive vias in the build-up structure to interconnect the terminals 284-L, 284-R and the one or more conductive traces. According to an embodiment, the conductive path 285 is a relatively low-resistance conductive path that is devoid of discrete passive or active circuit components (e.g., inductors, resistors, capacitors, transistors, and so on). The conductive path 285 extends across at least 10 percent of the device width, in one embodiment, across at least 25 percent of the device width, in another embodiment, and across at least 50 percent of the device width, in yet another embodiment. Again, each of terminals 284-L and 284-R may include a conductive bondpad that is exposed at the top surface of the die 201, and which is configured for attachment of one or more wirebonds (e.g., wirebond 1055 and/or 1056, FIG. 10).

The input terminal 284 is electrically connected to the drain terminals 227, 247', 247" of each of the pre-amplifier FETs 226, 246', 246", in an embodiment, to supply the same DC drain bias voltages to each FET 226, 246', 246". Again, to ensure that a significant amount of RF power is not lost through the bias circuit 282, main amplifier 220 and peaking amplifier portions 240', 240" are de-coupled (or isolated) from the bias circuit 282 with RF isolation circuits 286, 286', 286". More specifically, each RF isolation circuit 286, 286', 286" is electrically coupled between the input terminal 284 and a drain terminal 227, 247', 247" of a pre-amplifier FET 226, 246', 246". Again, each RF isolation circuit 286, 286', 286" may include an integrated, lumped-element equivalent of a quarter wave (lambda/4) transmission line, with a reactive component that resonates at the center frequency of operation. It should be noted that drain bias voltages may be supplied to final-stage amplifier FETs 230, 250', 250" through one or more device output leads (e.g., output lead 1020, FIG. 10) and a connection (e.g., wirebonds 1070, FIG. 10) between the device output lead and combining structure 290, in an embodiment.

As indicated previously, embodiments of Doherty amplifier IC 200 also may include one or more video bandwidth (VBW) circuits 278, 278', 278", 294 (e.g., VBW circuits 178, 178', 178", 194, FIG. 1) coupled between each amplification path and a ground reference. In the embodiment illustrated in FIG. 2, each VBW circuit 278, 278', 278" is electrically coupled to a node in the inter-stage portion of each amplification path (e.g., between the drain terminal 227, 247', 247" of a pre-amplifier FET 226, 246', 246" and the gate terminal 229, 249', 249" of a final-stage amplifier FET 230, 250', 250"), and VBW circuit 294 is electrically coupled to an RF cold point node 292 in shunt-L circuit 280 between inductors 282, 282', 282" and capacitor 283. According to an embodiment, each VBW circuit 278, 278', 278", 294 includes a series circuit of a resistor, an inductor, and a capacitor coupled between the inter-stage or RF cold point node and the ground reference. In other embodiments, a VBW circuit (e.g., VBW circuit 181, FIG. 1) may be coupled between the drain terminal 231, 251', 251" of a final-stage amplifier FET 230, 250', 250" and a ground reference, or a VBW circuit may be coupled between the gate terminal 225, 245', 245" of a pre-amplifier FET 226, 246', 246" and the ground reference. Multiple VBW circuits may be coupled along multiple points of each amplification path, as well. Further still, in other embodiments, all or portions of a VBW circuit 278, 278', 278", 294 may be provided by external circuitry (i.e., portions of the VBW circuits 278, 278', 278", 294 may be provided with circuitry that is not integrally formed with die 201).

The outputs (i.e., drain terminals 231, 251', 251") of each of the final-stage amplifier FETs 230, 250', 250" are electrically connected to combining node structure 290 (e.g., combining node structure 190, FIG. 1), which functions to combine the amplified RF signals produced by each of the final-stage amplifier FETs 230, 250', 250" into a single amplified output RF signal.

Combining node structure 290 includes an elongated conductive bondpad that is exposed at the top surface of die 201. According to an embodiment, the length of the combining node structure 290 extends from the outside end 252' of the drain terminal 251' of peaking amplifier final stage FET 250' to the outside end 252" of the drain terminal 251" of peaking amplifier final stage FET 250". As illustrated in FIG. 2, combining node structure 290 has three sections, including a leftmost section that is electrically connected to the drain terminal 251' of peaking amplifier final-stage FET 250', a central section that is electrically connected (through wirebonds 238) to the drain terminal 231 of main amplifier final-stage FET 230, and a rightmost section that is electrically connected to the drain terminal 251" of peaking amplifier final-stage FET 250". According to an embodiment, the combining node structure 290 is a continuous conductive bondpad, although the combining node structure 290 could include discontinuous but electrically connected sections, as well. Desirably, the drain terminals 251', 251" are connected to the combining node structure 290 with conductive paths having a negligible phase delay (i.e., as close to zero degrees of phase delay as possible, such as 10 degrees or less of phase delay), and in some embodiments, the drain terminals 251', 251" may be integrally formed portions of the combining node structure 290. In other words, the drain terminal manifold of the peaking amplifier final-stage FETs 250', 250" may form portions of the combining node structure 290, in some embodiments. As mentioned previously, base semiconductor substrate 310 is a high-resistivity substrate, and therefore potentially high losses that might otherwise occur with a relatively long transmission line (such as combining node structure 290) on a relatively low-resistivity substrate are significantly reduced in Doherty amplifier IC 200.

As mentioned previously, to compensate for the 90 degree phase delay difference between the main and peaking amplification paths at the inputs of amplifiers 220, 240', 240" (i.e., to ensure that the amplified signals are combined in phase at the combining node structure 290), an output phase delay circuit 236 (e.g., circuit 136, FIG. 1) is electrically coupled between the output (i.e., drain terminal 231) of the main amplifier final-stage FET 230 and the outputs (i.e., drain terminals 251', 251") of the peaking amplifier final-stage FETs 250', 250". Specifically, the output phase delay circuit 236 is configured to result in a phase difference that is substantially equal to 90 degrees (i.e., 90 degrees +/−10 degrees) between an RF signal at the drain terminal 231 of the main amplifier final-stage FET 230 and RF signals at the drain terminals 251', 251" of the peaking amplifier final stage FETs 250', 250".

According to an embodiment, the output phase delay circuit 236 has a CLC (capacitance-inductance-capacitance) topology between drain terminal 231 and drain terminals 251', 251".

The first (shunt) capacitance includes the drain-source capacitance, $C_{dsM}$, of the main amplifier final-stage FET 230, minus a portion of $C_{dsM}$ that is compensated for by a shunt inductance (e.g., shunt inductance 182, FIG. 1, which is provided by wirebonds 282 and integrated inductors 282', 282" of shunt-L circuit 280), as will be explained in more detail below. In other words, the first shunt capacitance may be represented by $A \times C_{dsM}$, where A<1.0, and $(1.0-A) \times C_{dsM}$ is equivalent to a negative capacitance provided by a compensating shunt inductance (e.g., wirebonds 282 and integrated inductors 282', 282") that is electrically coupled in parallel with $C_{dsM}$ between the main amplifier final-stage FET drain terminal 231 and the die ground reference (e.g., conductive layer 328, FIG. 3).

Desirably, for a symmetrical Doherty amplifier, the compensating shunt inductance (e.g., wirebonds 282 and integrated inductors 282', 282") is selected so that the effective capacitance of $C_{dsM}$ (i.e., the capacitance value of capacitor 281 as altered by the above-described shunt inductance) is approximately equal to the combined effective drain-source capacitances, $C_{dsP}$, of the peaking amplifier final-stage FETs 250', 250". For an asymmetrical Doherty amplifier, such as that illustrated in FIG. 2, the effective drain-source capacitance, $C_{dsM}$, of the main amplifier final-stage FET 230 may be designed to be lower than the combined effective drain-source capacitances, $C_{dsP}$, of the peaking amplifier final-stage FETs 250', 250". In an asymmetrical Doherty amplifier embodiment, the effective capacitance of $C_{dsM}$ should be designed as follows: 1) so that the transmission path (or "pseudo-transmission line") between the main amplifier final-stage FET 230 and the peaking amplifier final-stage FETs 250', 250" provides about a 90 degree phase shift at the center frequency of operation, and 2) so that:

$$L_D = \frac{1}{(2*\pi*freq)^2 * C_{DS}}$$

$$Z_C = \sqrt{\frac{L_D}{C_{DS}}},$$

where freq is the center frequency of operation, LD is the inductance of the conductive path between the drain terminal 231 of the main amplifier final-stage FET 230 and the drain terminals 251', 251" of the peaking amplifier final-stage FETs 250', 250", $C_{DS}$ is the effective output capacitance of the main amplifier final-stage FET 230 and/or the peaking amplifier final-stage FETs 250', 250", and $Z_C$ is the characteristic impedance of the pseudo-transmission line between the drain terminal 231 of the main amplifier final-stage FET 230 and the drain terminals 251', 251" of the peaking amplifier final-stage FETs 250', 250". For example, the effective capacitance of $C_{dsM}$ may have a capacitance value in a range of about 3 picofarads (pF) to about 10 pF (e.g., about 5 pF to about 6 pF) at a center frequency of operation of about 2.0 gigahertz (GHz), in an embodiment, although the center frequency of operation and/or the effective capacitance could be lower or higher, as well.

A plurality of wirebonds 238 are electrically connected between the drain terminal 231 of the main amplifier final-stage FET 230 and combining node structure 290. More specifically, first ends of the wirebonds 238 are connected to the drain terminal 231, and second ends of the wirebonds 238 are connected to the combining node structure 290. The inductance in the CLC topology of the output phase delay circuit 236 is provided by the series combination of wirebonds 238 and portions of the combining node structure 290 that extend between the landing points of the wirebonds 238 on the structure 290 and the drain terminals 251', 251" of the peaking amplifier final-stage FETs 250', 250". According to an embodiment, the series combination of the wirebonds 238 and those portions of the combining node structure 290 have a combined inductance in a range of about 0.8 nanohenries (nH) to about 1.2 nH at a center frequency of operation of about 2.0 GHz, although the center frequency and/or the combined inductance could be lower or higher, as well.

Finally, the second (shunt) capacitance in the CLC topology of the output phase delay circuit 236 approximately equals the combined effective drain-source capacitances, $C_{dsP}$, of the peaking amplifier final-stage FETs 250', 250". Although not shown in FIG. 2, the effective $C_{dsP}$ capacitances may be affected by additional shunt inductances (e.g., shunt inductance 185, 985, FIGS. 1, 9). The $C_{dsP}$ capacitances have a total combined effective capacitance value in a range of about 5 pF to about 10 pF (e.g., about 7 pF to about 8 pF) at a center frequency of operation of about 2.0 GHz, in an embodiment, although the center frequency and/or the effective capacitance could be lower or higher, as well.

To summarize, the 90 degree phase difference between drain terminal 231 and drain terminals 251', 251" is provided by an output phase delay circuit 236 with a CLC topology, where that topology includes a first shunt capacitance (i.e., $C_{dsM}$ as altered by the above-described shunt inductance 282, 282', 282"), a series inductance (provided by wirebonds 238 and portions of combining node structure 290), and a second shunt capacitance (provided by $C_{dsP}$).

According to an embodiment, Doherty amplifier IC 200 also may include isolation structures (not illustrated) positioned between wirebonds 238 and peaking amplifier final-stage FETs 250', 250". The isolation structures may be configured to short the electromagnetic fields emanating from the wirebonds 238 during operation from the peaking amplifier final-stage FETs 250', 250". According to an embodiment, the isolation structures each may include a plurality of wirebonds, each of which launch and land on the surface of the die 201 (e.g., on a grounded conductive pad on the top surface of the die 201). The plurality of wirebonds can be arranged in rows, for example, and the wirebonds of the isolation structures can have heights that are approximately equal to the height of wirebonds 238.

According to an embodiment, a shunt-L circuit 280 (e.g., shunt-L circuit 180, FIG. 1) is coupled between the final-stage main amplifier drain terminal 231 and the die ground reference (e.g., conductive layer 328, FIG. 3), in an embodiment. As mentioned previously, an inductance of the shunt-L circuit 280 is configured to compensate for (e.g., resonate out) at least a portion of the drain-source capacitance at the drain terminal 231 of the final-stage main amplifier FET 230. In an embodiment, the shunt-L circuit 280 includes a shunt inductance (e.g., inductance 182, FIG. 1) and a shunt capacitance (e.g., capacitance 184, FIG. 1) coupled in series between the drain terminal 231 of the final-stage peaking amplifier FET 230 and the ground reference. The shunt capacitance is configured to provide a low-impedance path to ground for very low-frequency signal energy (e.g., DC), and a high impedance path to ground for signal energy in the band of operation of the amplifier 200. In alternate embodiments, as will be discussed in more detail in conjunction with FIG. 9 later, a shunt-L circuit (e.g., shunt-L circuit 181, FIG. 1) alternatively may be coupled instead between the final-stage peaking amplifier drain terminal(s) 251', 251" and the die ground reference, or shunt-L circuits may be coupled between the drain terminals 231, 251', 251" and the die ground reference.

The shunt inductance of the shunt-L circuit 280 is implemented with a set of one or more wirebonds 282 coupled in series with one or more integrally-formed inductors 282', 282", in an embodiment. The wirebond(s) 282, which represent a first integrated inductance, each have a first end that is connected to bondpad that in turn is closely electrically coupled to the final-stage main amplifier drain terminal 231, and a second end that is connected to a bondpad 283 (referred to below as an "inter-inductor node"), where both bondpads are integrally-formed with and exposed at the top surface of die 201. Essentially, the set of wirebonds 282 may be considered an inductance, where the first end(s) of the wirebonds 282 correspond to a first terminal of the inductance, and the second end(s) of the wirebonds 282 correspond to a second terminal of the inductance. In alternate embodiments, more or fewer than two wirebonds may be used to implement the first inductance. In still other alternate embodiments, as will be discussed in more detail in conjunction with FIGS. 6 and 8 later, the set of wirebonds 282 may be replaced with one or more discrete inductors with first and second terminals connected to distinct bonding pads exposed at the top surface of the die.

The integrated inductors 282', 282", which together represent a second inductance, are coupled in parallel between the inter-inductor node 283 and a second conductive node 292, which in one embodiment may be an RF cold point node. More specifically, each of the integrated inductors 282', 282" includes an integrally-formed spiral inductor formed from portions of one or more layers of the build-up structure of the die 201 (e.g., build-up layers 312, FIG. 3), where a first terminal (or end) of each spiral inductor is coupled to the inter-inductor node 283, and a second terminal (or end) of each spiral inductor is coupled to node 292. In alternate embodiments, the two, parallel-coupled integrated inductors 282', 282" may be replaced with a single integrated inductor, with more than two parallel-coupled integrated inductors, or with one or more discrete inductors coupled to the top surface of the die 201, as will be discussed later in conjunction with FIGS. 6 and 8.

As used herein, a "band of operation" or "operational band" of amplifier 200 means a range of frequencies that is bounded by lower and upper −3 dB cutoff frequencies. According to an embodiment, the shunt inductance of the shunt-L circuit 280 has an inductance value that is selected so that the shunt inductance and the drain-source capacitance, CdsM, of the final-stage main amplifier FET 230 resonate at a frequency that is below a band of operation of the amplifier 200. For example, the shunt inductance and CdsM may resonate at a frequency that is at least 300 megahertz (MHz) below a band of operation of the amplifier 200 (e.g., the resonant frequency of the shunt inductance and CdsM may be 300-500 MHz below the band of operation, although the resonant frequency may be higher or lower, as well). As a specific non-limiting example, when amplifier 200 has a center frequency of operation, f0, of 2.0 GHz and a 400 MHz wide band of operation between a lower cutoff frequency of 1.8 GHz and an upper cutoff frequency of 2.2 GHz, the resonant frequency of the shunt inductance and CdsM may be 300-500 MHz or more below the lower cutoff frequency (e.g., the resonant frequency may be between 1.3 GHz and 1.5 GHz, although the resonant frequency may be lower or higher, as well). In other embodiments, the center frequency of operation may be less or greater than 2.0 GHz, and the band of operation may be narrower or wider, and accordingly, the shunt inductance value may be selected to resonate with CdsM at a different frequency below the corresponding band of operation.

The shunt inductance of the shunt-L circuit essentially improves the quality of the combining node structure 290 (e.g., improves Zopt and Zmod at the center frequency of operation) by reducing the difference between the effective drain-source capacitances of the final-stage main and peaking amplifier transistors 230, 250', 250". More specifically, because amplifier 200 is an asymmetrical Doherty amplifier, the drain-source capacitance (CdsP) of the final-stage peaking amplifier transistors 250', 250" is larger than the drain-source capacitance (CdsM) of the final-stage main amplifier transistor 230. When the main-to-peaking size ratio is about 1:2, for example, the drain-source capacitance of the final-stage peaking amplifier transistors 250', 250" may be about 50-80 percent greater than the drain-source capacitance (CdsM) of the final-stage main amplifier transistor 230 (e.g., for a 1:2 asymmetry ratio, CdsM may be about 3.7 pF and CdsP may be about 7.4 pF). The shunt inductance of the shunt-L circuit 280 is configured to reduce a difference between the drain-source capacitance of the final-stage main amplifier FET 230, CdsM, and an effective drain-source capacitance of the final-stage peaking amplifier FETs 250', 250", and in some embodiments, the shunt inductance is configured to make the effective drain-source capacitance of the final-stage main amplifier FET 230 approximately equal to the drain-source capacitance of the final-stage peaking amplifier FETs 250', 250" (or the effective capacitance of the final-stage peaking amplifier FETs if another shunt inductance is closely electrically coupled to the drains of the final-stage peaking amplifier FETs).

Utilizing the shunt-L circuit 280 to resonate out at least some of the drain-source capacitance of the final-stage main amplifier transistor 230 essentially equalizes (or significantly reduces the difference between) the effective drain-source capacitance(s) of the main and peaking final-stage amplifier transistors 230, 250', 250". In other words, a total shunt inductance provided by the series-coupled arrangement of wirebond(s) 282 and inductors 282', 282" is selected to resonate out at least some of the drain-source capacitance of the final-stage main amplifier transistor 230.

Factors affecting the selection of the total shunt inductance include, for example, the asymmetry ratio between the main and peaking amplifier transistors 230, 250', 250" (and thus the difference in drain-source capacitance between the transistors 230, 250', 250"), the power level of the amplifier, and the center frequency of operation of the amplifier 200. Generally, as the asymmetry ratio, the center frequency of operation, and/or the power level increases, the selected total shunt inductance decreases, and conversely as the asymmetry ratio, the center frequency of operation, and/or the power level decreases, the selected total shunt inductance increases. For example, for a 30 watt amplifier 200 with a 1:2 asymmetry ratio and a center frequency, f0, of about 2 GHz, a total shunt inductance provided by the series-coupled arrangement of wirebond(s) 282 and inductors 282', 282" may be in a range of about 1 nH to about 10 nH (e.g., about 5 nH) although the total shunt inductance may be lower or higher, as well. All other things being equal, if the center frequency of operation were increased to 4 GHz, the selected total shunt inductance could be decreased to about half the value for a 2 GHz amplifier. Alternatively, if the power level were decreased to 15 watts with all other things being equal, the selected total shunt inductance could be roughly doubled for a 2 GHz amplifier.

According to an embodiment, a portion of the total shunt inductance of the shunt-L circuit 280 is provided by wirebond(s) 282, and another portion of the total shunt inductance is provided by integrated inductors 282', 282". In some embodiments, the portion of the total shunt inductance that is provided by wirebond(s) 282 could be between about 20 percent and about 80 percent of the total shunt inductance of the shunt-L circuit 280. For example, a first inductance provided by wirebond(s) 282 may have an inductance value in a range of about 0.5 nH to about 9.5 nH, and a second inductance provided by parallel-coupled integrated inductors 282', 282" may be in a range of about 0.5 nH to about 9.5 nH for an amplifier 200 with a center frequency of operation of about 2 GHz. Although specific example ranges and values are provided above, in other embodiments, the inductance value of any of elements 282, 282', 282", and/or the total inductance value of all elements 282, 282', 282" may be smaller or larger than the above given ranges.

The shunt capacitance of the shunt-L circuit 280 is implemented with an integrally-formed capacitor 281, in an embodiment. Capacitor 281 has a first terminal (or plate) electrically coupled to node 292, and a second terminal (or plate) electrically coupled to the die ground reference (e.g., conductive layer 328, FIG. 3), in an embodiment. According to an embodiment, capacitor 281 may include one or MIM capacitors formed within the build-up layers of the die 201 (e.g., layers 312, FIG. 3), for example. Alternatively, capacitor 281 may be integrally-formed within the base semiconductor substrate (e.g., substrate 310, FIG. 3) with vertical and/or horizontal conductive layers (e.g., polysilicon) separated by dielectric material. In still other embodiments, as will be described in more detail later in conjunction with FIGS. 7 and 8, capacitor 281 may be a discrete capacitor coupled to the surface of the die. In still other alternate embodiments, node 292 may be coupled to a bondpad, capacitor 281 may be connected to a substrate other than the die 201, and wirebonds may be used to electrically couple the bondpad (or node 292) to the off-die capacitor 281. Either way, according to an embodiment, a capacitance value of capacitor 281 is in a range of about 500 pF to about 2000 pF, although the capacitance value of capacitor 281 may be lower or higher, as well.

Node 292 may correspond to an RF cold point node, and a video bandwidth circuit 294 may be electrically coupled between node 292 and the ground reference node (e.g., layer 328, FIG. 3). According to an embodiment, and as indicated by the circuit schematic next to VBW circuit 294, VBW circuit 294 may include a series circuit that includes multiple components, and more specifically that includes a resistor (or resistance), an inductor (or inductance), and a capacitor (or capacitance) coupled in series in any order between node 292 and the ground reference node.

Although the embodiment of the shunt-L circuit 280 shown in FIGS. 2-3 includes a series-coupled circuit that includes particular components (i.e., wirebonds 282, integrated inductors 282', 282", and integrated capacitor 281) in a particular series order, other embodiments may include different implementations of the shunt-L circuit 280, including different series arrangements of the components, different physical types of components, additional components, or fewer components. By way of non-limiting example, a different series arrangement may include one or more integrated inductors (e.g., inductors 282' and/or 282") with first terminals directly electrically connected to the drain terminal 231, and with second terminals coupled to an inter-inductor bondpad (e.g., bondpad 283), and further may include wirebond(s) (e.g., wirebonds 282) with first ends coupled to the inter-inductor bondpad, and with second ends coupled to node 285. In addition, the physical components of the inductance of the shunt-L circuit 280 may include any combination of inductive components selected from one or more integrally-formed inductors, one or more sets of wirebonds, and/or one or more discrete inductors, and the inductive components of the shunt-L circuit 280 may be interconnected using any series and/or parallel arrangement to achieve the desired total inductance value for the shunt inductance of the shunt-L circuit 280. Similarly, the physical components of the capacitance of the shunt-L circuit may include any combination of capacitive components selected from one or more integrally-formed capacitors and/or one or more discrete capacitors, and the capacitive components of the shunt-L circuit 280 may be interconnected using any series and/or parallel arrangement to achieve the desired total capacitance value for the shunt capacitance of the shunt-L circuit 280.

For example, FIGS. 4-9 illustrate top views of portions of Doherty power amplifier ICs 400, 500, 600, 700, 800, 900, in accordance with six alternate example embodiments. Each of the illustrated ICs 400, 500, 600, 700, 800, 900 include final-stage amplifier transistors 230, 250', 250", combining node structure 290, and additional upstream components of an integrated Doherty power amplifier IC (not illustrated), as previously described in conjunction with FIGS. 1-3 (e.g., including power splitter 104, 204, pre-amplifiers 126, 146', 146", 226, 246', 246", and bias circuitry 170, 170', 170", 270, 270', 270"). Each of ICs 400, 500, 600, 700, 800, 900 differ from the previously-described embodiments in the manner that the shunt-L circuit(s) (e.g., shunt-L circuits 180, 181, FIG. 1) are implemented.

Figure 4:
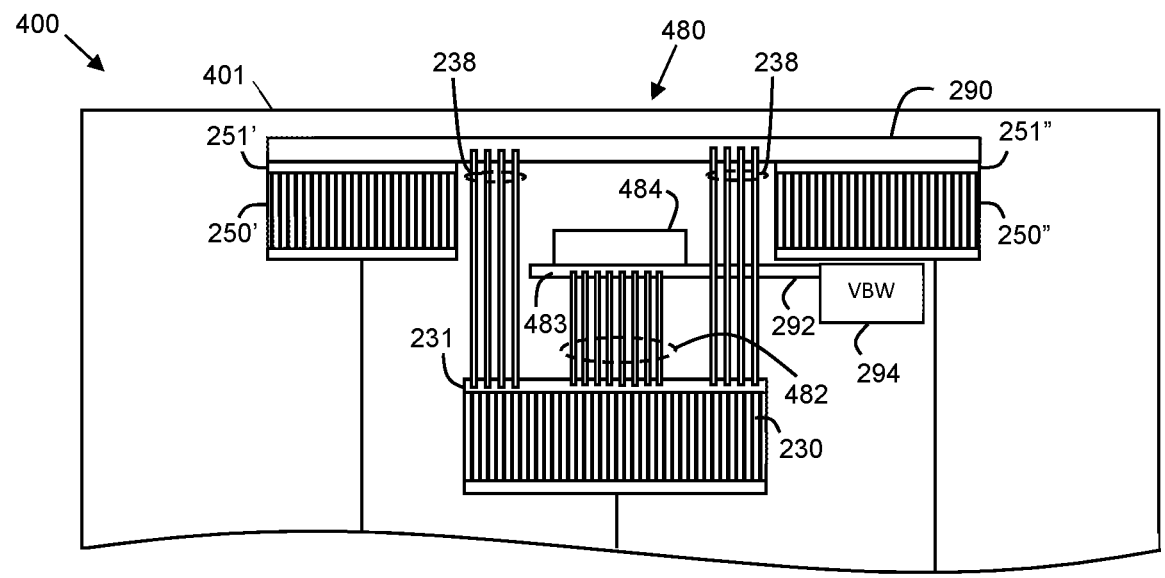
FIG. 4 is a top view of a portion of a Doherty power amplifier IC, in accordance with another example embodiment.

More specifically, in the Doherty power amplifier IC 400 of FIG. 4, a shunt-L circuit 480 (e.g., circuit 180, FIG. 1) coupled between the final-stage main amplifier drain terminal 231 and the ground reference node (e.g., layer 328, FIG. 3) is implemented in die 401 with an integrated shunt inductance (e.g., inductance 182, FIG. 1) in the form of a set of one or more wirebonds 482, which are coupled in series with integrated shunt capacitance 484 (e.g., capacitance 184, FIG. 1). More specifically, wirebonds 482 each have a first end that is connected to a bondpad that in turn is closely electrically coupled to the final-stage main amplifier drain terminal 231, and a second end that is connected to a bondpad 483, where both bondpads are integrally-formed with and exposed at the top surface of die 401. As discussed previously, bondpad 483 may correspond to an RF cold point node 292, and a video bandwidth circuit 294 may be electrically coupled between node 292 and the ground reference node.

Figure 5:
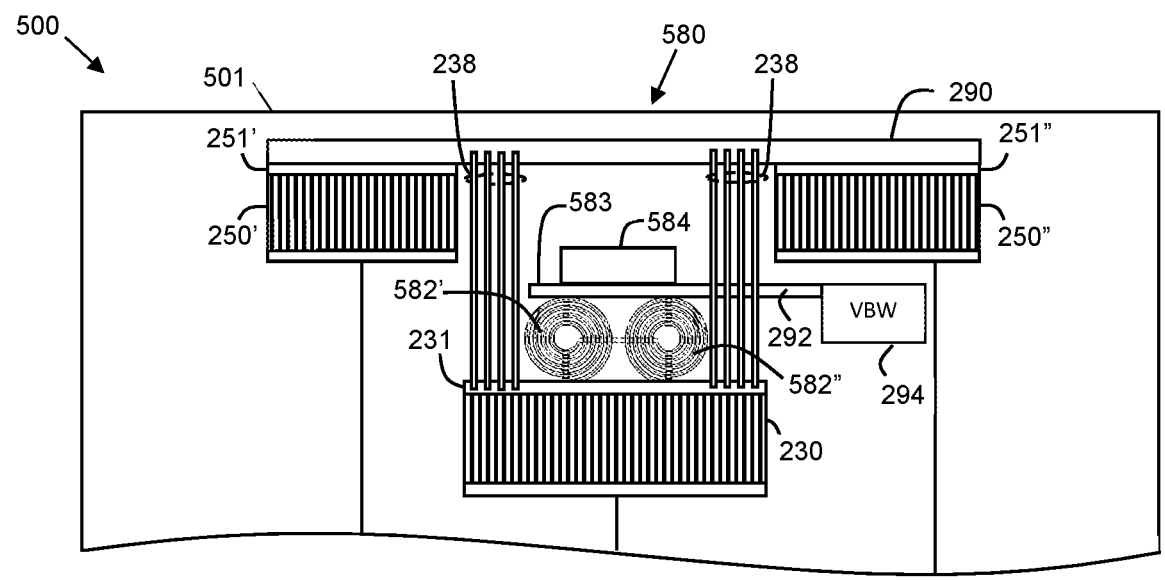
FIG. 5 is a top view of a portion of a Doherty power amplifier IC, in accordance with yet another example embodiment.

In the Doherty power amplifier IC 500 of FIG. 5, a shunt-L circuit 580 (e.g., circuit 180, FIG. 1) coupled between the final-stage main amplifier drain terminal 231 and the ground reference node (e.g., layer 328, FIG. 3) is implemented in die 501 with an integrated shunt inductance (e.g., inductance 182, FIG. 1) in the form of one or more, parallel-coupled, integrated spiral inductors 582', 582", which are coupled in series with integrated shunt capacitance 584 (e.g., capacitance 184, FIG. 1). More specifically, integrated spiral inductors 582', 582" each have a first end that is connected to a node that in turn is closely electrically coupled to the final-stage main amplifier drain terminal 231, and a second end that is connected to node 583. As discussed previously, node 583 may correspond to an RF cold point node 292, and a video bandwidth circuit 294 may be electrically coupled between node 292 and the ground reference node.

In the Doherty power amplifier IC 600 of FIG. 6, a shunt-L circuit 680 (e.g., circuit 180, FIG. 1) coupled between the final-stage main amplifier drain terminal 231 and the ground reference node (e.g., layer 328, FIG. 3) is implemented in die 601 with a shunt inductance (e.g., inductance 182, FIG. 1) in the form of a set of one or more, parallel-coupled, discrete ("chip") inductors 682', 682", which are coupled in series with integrated shunt capacitance 684 (e.g., capacitance 184, FIG. 1). More specifically, each discrete inductor 682', 682" has a first terminal that is connected to a bondpad that in turn is closely electrically coupled to the final-stage main amplifier drain terminal 231, and a second terminal that is connected to a bondpad 683, where both bondpads are integrally-formed with and exposed at the top surface of die 601. As discussed previously, bondpad 683 may correspond to an RF cold point node 292, and a video bandwidth circuit 294 may be electrically coupled between node 292 and the ground reference node.

In still other embodiments, the shunt capacitance (e.g., capacitance 184, FIG. 1) alternatively may be implemented as a discrete ("chip") capacitor. For example, in the Doherty power amplifier IC 700 of FIG. 7, a shunt-L circuit 780 (e.g., circuit 180, FIG. 1) coupled between the final-stage main amplifier drain terminal 231 and the ground reference node (e.g., layer 328, FIG. 3) is implemented in die 701 with an integrated shunt inductance (e.g., inductance 182, FIG. 1) in the form of a set of one or more wirebonds 782, which are coupled in series with a discrete shunt capacitor 784 (e.g., capacitance 184, FIG. 1). More specifically, wirebonds 782 each have a first end that is connected to a bondpad that in turn is closely electrically coupled to the final-stage main amplifier drain terminal 231, and a second end that is connected to a bondpad 783, and capacitor 784 has a first terminal connected to bondpad 783, and a second terminal connected to a bondpad 785, which in turn is electrically coupled to the ground reference node. As discussed previously, bondpad 783 may correspond to an RF cold point node 292, and a video bandwidth circuit 294 may be electrically coupled between node 292 and the ground reference node.

Figure 8:
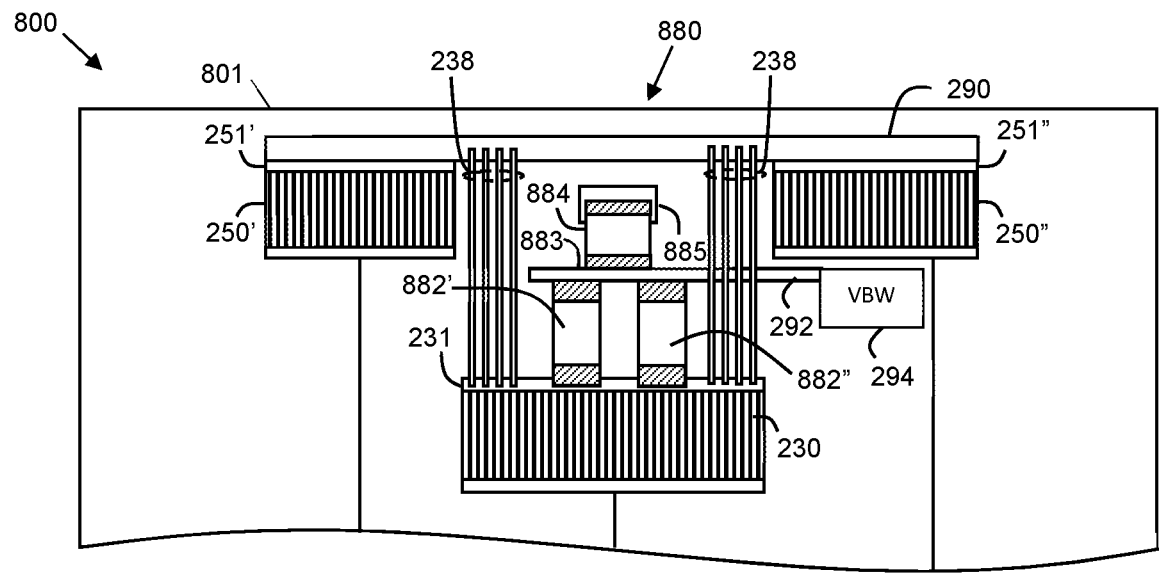
FIG. 8 is a top view of a portion of a Doherty power amplifier IC, in accordance with yet another example embodiment.
Figure 9:
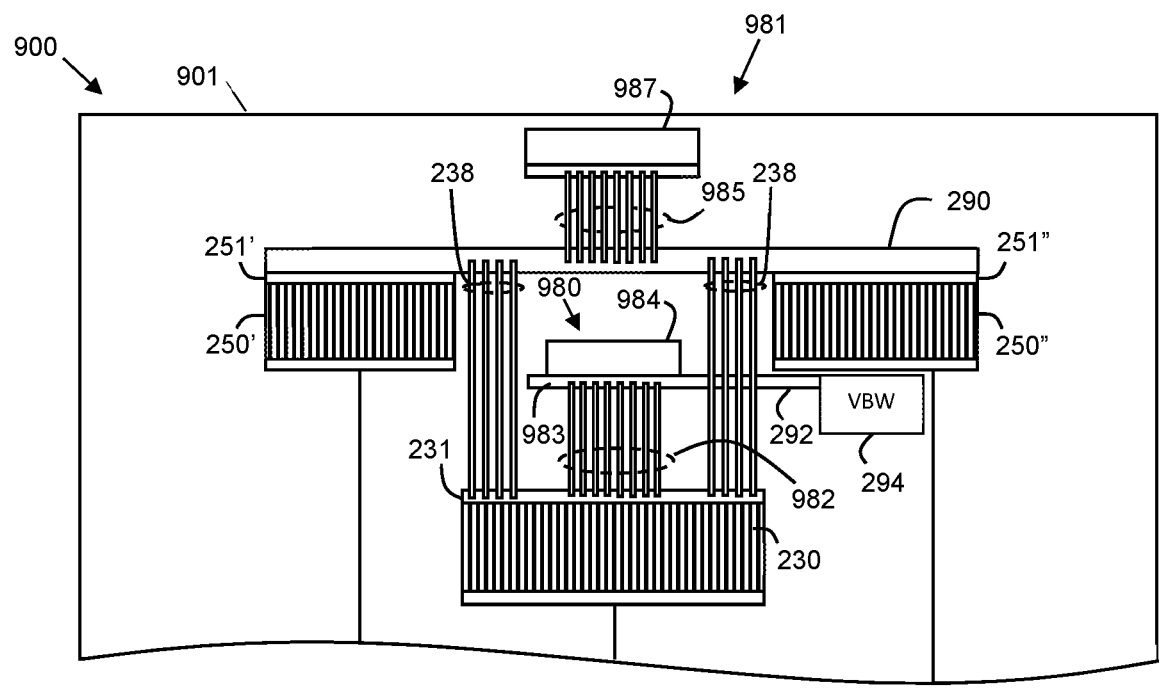
FIG. 9 is a top view of a portion of a Doherty power amplifier IC, in accordance with yet another example embodiment.

In the Doherty power amplifier IC 800 of FIG. 8, a shunt-L circuit 880 (e.g., circuit 180, FIG. 1) coupled between the final-stage main amplifier drain terminal 231 and the ground reference node (e.g., layer 328, FIG. 3) is implemented in die 801 with an integrated shunt inductance (e.g., inductance 182, FIG. 1) in the form of a set of one or more, parallel-coupled, discrete inductors 882', 882", which are coupled in series with a discrete shunt capacitor 884 (e.g., capacitance 184, FIG. 1). More specifically, each discrete inductor 882', 882" has a first terminal that is connected to a bondpad that in turn is closely electrically coupled to the final-stage main amplifier drain terminal 231, and a second terminal that is connected to a bondpad 883, and capacitor 884 has a first terminal connected to bondpad 883, and a second terminal connected to a bondpad 885, which in turn is electrically coupled to the ground reference node. As discussed previously, bondpad 883 may correspond to an RF cold point node 292, and a video bandwidth circuit 294 may be electrically coupled between node 292 and the ground reference node.

In still other alternate embodiments, a Doherty power amplifier IC also or alternatively may include a shunt-L circuit (e.g., shunt-L circuit 181, FIG. 1) coupled to the combining node 290 and/or to the drain terminals 251', 251" of the final-stage peaking amplifier transistors 250', 250". For example, the Doherty power amplifier IC 900 of FIG. 9 includes a first shunt-L circuit 980 (e.g., circuit 180, FIG. 1) coupled between the final-stage main amplifier drain terminal 231 and the ground reference node (e.g., layer 328, FIG. 3), and a second shunt-L circuit 981 (e.g., circuit 181, FIG. 1) coupled between the combining node 290 (and/or the final-stage peaking amplifier drain terminals 251', 251") and the ground reference node.

The first shunt-L circuit 980 is implemented in die 901 with an integrated shunt inductance (e.g., inductance 182, FIG. 1) in the form of a set of one or more wirebonds 982, which are coupled in series with integrated shunt capacitance 984 (e.g., capacitance 184, FIG. 1) in a manner similar to shunt-L circuit 480 (FIG. 4). Further, the second shunt-L circuit 981 is implemented in die 901 with an integrated shunt inductance (e.g., inductance 185, FIG. 1) in the form of a set of one or more wirebonds 985, which are coupled in series with integrated shunt capacitance 987 (e.g., capacitance 187, FIG. 1) in a manner similar to shunt-L circuit 480 (FIG. 4). Although the first and second shunt-L circuits 980, 981 are shown to have configurations similar to shunt-L circuit 480 (FIG. 4), the first and second shunt-L circuits 980, 981 alternatively may have any of the aforementioned configurations discussed in detail in conjunction with FIG. 2 or 5-8. Further, as discussed previously, bondpad 983 may correspond to an RF cold point node 292, and a video bandwidth circuit 294 may be electrically coupled between node 292 and the ground reference node.

Doherty power amplifier ICs 200, 400, 500, 600, 700, 800, 900 may be packaged and/or incorporated into a larger electrical system in a variety of ways. For example, Doherty ICs 200, 400, 500, 600, 700, 800, 900 may be packaged within an overmolded or air-cavity power device package (e.g., package 1004, FIG. 10). Alternatively, Doherty ICs 200, 400, 500, 600, 700, 800, 900 may be packaged in a surface-mount type of package, such as a no-leads package (e.g., a dual-flat no leads (DFN) or quad-flat no leads (QFN) package). In still other embodiments, Doherty ICs 200, 400, 500, 600, 700, 800, 900 may be mounted directly to a module or PCB substrate surface.

Figure 10:
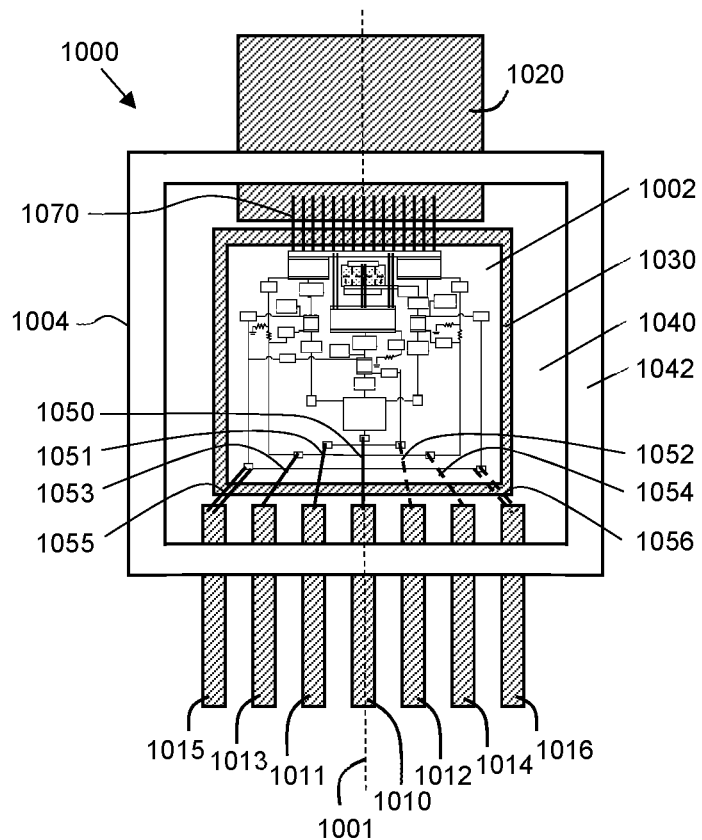
FIG. 10 is a top view of a Doherty amplifier device packaged in a high-power package, in accordance with an example embodiment.

By way of example, FIG. 10 is a top view of a Doherty amplifier device 1000 that includes a Doherty IC 1002 (e.g., Doherty IC 200, 400, 500, 600, 700, 800, 900, FIGS. 2-9) packaged in a high-power, discrete device package 1004, in accordance with an example embodiment. Package 1004 includes a plurality of conductive input signal and bias leads 1010-1016 and at least one output lead 1020. The input signal and bias leads 1010-1016 are positioned at an input side of the package 1004, and the at least one output lead 1020 is positioned at an output side of the package 1004. The input side (e.g., input side 210, FIG. 2) of the Doherty IC die 1002 is proximate to and parallel with the input side of the device package 1004, in an embodiment.

According to an embodiment, the bias leads 1011-1016 are symmetrically arranged on opposite sides of a device bisection line 1001. According to an embodiment, the device bisection line 1001 extends between the opposed input and output sides of the Doherty IC 1002 (and between opposed input and output sides of the package 1004) to divide the Doherty IC 1002 and the device package 1004 into two portions (e.g., a left portion and a right portion). The left and right portions of the Doherty IC 1002 may be essentially equal in size, or they may be unequal. In some embodiments, the device bisection line 1001 extends through the RF input terminal (e.g., input terminal 202, FIG. 2) and through the RF output terminal (e.g., combining node structure 290, FIG. 2). In addition, package 1004 includes a package substrate, such as a conductive flange 1030, to which Doherty IC 1002 is physically and electrically connected (e.g., with conductive epoxy, solder, brazing, sintering, or other conductive connection methods). Finally, package 1004 includes non-conductive structural features or materials, such as molding compound and/or other insulating materials, which hold the leads 1010-1016, 1020 and the flange 1030 in fixed orientations with respect to each other.

Electrically conductive connections, such as conductive wirebonds 1050-1056, electrically connect input signal and bias voltage bond pads (or terminals) on die 1002 to conductive leads 1010-1016 on an input side of the device 1000. For example, one or more first wirebonds 1050 may electrically connect an input RF signal lead 1010 to a first bondpad corresponding to an input terminal (e.g., input terminal 202, FIG. 2), and the input RF signal lead 1010 may be used to convey an input RF signal to the Doherty IC 1002.

As discussed previously in conjunction with FIG. 2, bias circuits (e.g., bias circuits 270, 270', 270", 282, FIG. 2) on Doherty IC 1002 may have multi-point input terminals with electrically connected first and second, or left (L) and right (R) terminals (e.g., 271-L/271-R, 271'-L/271'-R, and 284-L/284-R, FIG. 2). When coupled to device package 1004, the first (e.g., left) terminals (e.g., terminals 271-L, 271-L', 284-L, FIG. 2) are positioned to one side (e.g., to the left) of bisection line 1001, and the second (e.g., right) terminals (e.g., terminals 271-R, 271'-R, 284-R, FIG. 2) are positioned to the other side (e.g., to the right) of bisection line 1001. As described previously, corresponding pairs of left and right terminals are electrically connected together through a conductive path (e.g., conductive path 272, 272', 285, FIG. 2). With this configuration, an electrical connection may be made to each bias circuit input terminal through a bias lead 1011, 1013, 1015 that is left of the bisection line 1001, through a bias lead 1012, 1014, 1016 that is right of the bisection line 1001, or through bias leads both to the left and to the right of bisection line 1001. Accordingly, when Doherty amplifier device 1000 is attached to a system substrate (e.g., PCB 1110, FIG. 11), bias voltage connections may be made from the left, from the right, or both from the left and the right of the device bisection line 1001. This feature provides increased design flexibility for the system substrates to which Doherty amplifier device 1000 is connected.

To make the bias connections, one or more second wirebonds 1051 and/or 1052 are used to electrically connect one or more main amplifier gate bias leads 1011 and/or 1012 to second and/or third bondpads corresponding to left and right terminals (e.g., terminals 271-L, 271-R, FIG. 2), respectively, of a main amplifier gate bias circuit (e.g., gate bias circuit 270, FIG. 2). Similarly, one or more third wirebonds 1053 and/or 1054 are used to electrically connect one or more peaking amplifier gate bias leads 1013 and/or 1014 to fourth and/or fifth bondpads corresponding to left and right terminals (e.g., terminals 271'-L, 271'-R, FIG. 2), respectively, of peaking amplifier gate bias circuits (e.g., gate bias circuits 270', 270", FIG. 2). Finally, one or more fourth wirebonds 1055 and/or 1056 are used to electrically connect one or more drain bias leads 1015 and/or 1016 to sixth and/or seventh bondpads corresponding to left and right terminals (e.g., terminals 284-L, 284-R, FIG. 2), respectively, of a drain bias circuit (e.g., drain bias circuit 282, FIG. 2).

According to an embodiment, the output of Doherty IC 1002 (and more specifically the combining node structure 290, FIG. 2) is electrically connected to the output lead 1020 through a plurality of wirebonds 1070. According to an embodiment, package 1004 is designed so that die 1002, and more specifically the combining node structure of die 1002, may be positioned very close to output lead 1020 when die 1002 is coupled to package 1004. Accordingly, wirebonds 1070 may be relatively short. In addition, the number of wirebonds 1070 may be selected to be relatively large (e.g., 20-40 wirebonds, more or less), which renders wirebonds 1070 a relatively low parasitic inductive element. According to an embodiment, wirebonds 1070 have an inductance value in a range of about 20 pH to about 70 pH (e.g., about 60 pH) although the inductance value may be smaller or larger, as well. Desirably, wirebonds 1070 are designed so that the inductance value of wirebonds 1070 is as low as possible.

In some embodiments, leads 1010-1016, 1020 and flange 1030 may form portions of a lead frame. To complete an overmolded package during device manufacturing, after attachment of die 1002 and wirebonds 1050-1056, 1070, the die 1002, the interior ends of leads 1010-1016, 1020, wirebonds 1050-1056, 1070, and the upper and side surfaces of flange 1030 may be encapsulated with a non-conductive (e.g., plastic) molding compound 1040, 1042 (only partially shown in FIG. 10 to avoid obscuring the interior components of device 1000). The molding compound 1040, 1042 defines the perimeter of the device 1000 from which leads 1010-1016, 1020 protrude, and also defines the top surface of the device 1000. The bottom surface of the device 1000 is defined partially by the molding compound 1040, and partially by the bottom surface of flange 1030. Accordingly, when appropriately coupled to a system substrate (e.g., PCB 1110, FIG. 11), flange 1030 may function to convey a ground reference to the die 1002 (e.g., through the bottom conductive layer 328, FIG. 3), and also may function as a heat sink for the device 1000.

In a similar but different embodiment, leads 1010-1016, 1020 with the configurations shown in FIG. 10 may be replaced with lands of a no-leads package. The flange 1030 and lands again may form a lead frame to which the die 1002 and wirebonds 1050-1056, 1070 are attached, and again the assembly may be encapsulated with a non-conductive molding compound to form a no-leads, surface mount device (e.g., a DFN or QFN device).

In other embodiments, package 1004 may be an air-cavity package. In such an embodiment, flange 1030 may have a larger perimeter, which is equal or approximately equal to the perimeter of the device 1000. A non-conductive insulator (e.g., ceramic, plastic, or another material) with a frame shape may be attached to the top surface of the flange, leads 1010-1016, 1020 may be placed over the non-conductive insulator, wirebonds 1050-1056, 1070 are attached, and a cap (not illustrated) is placed over the frame opening to encase the interior components of the device 1000 in an air cavity.

Figure 11:
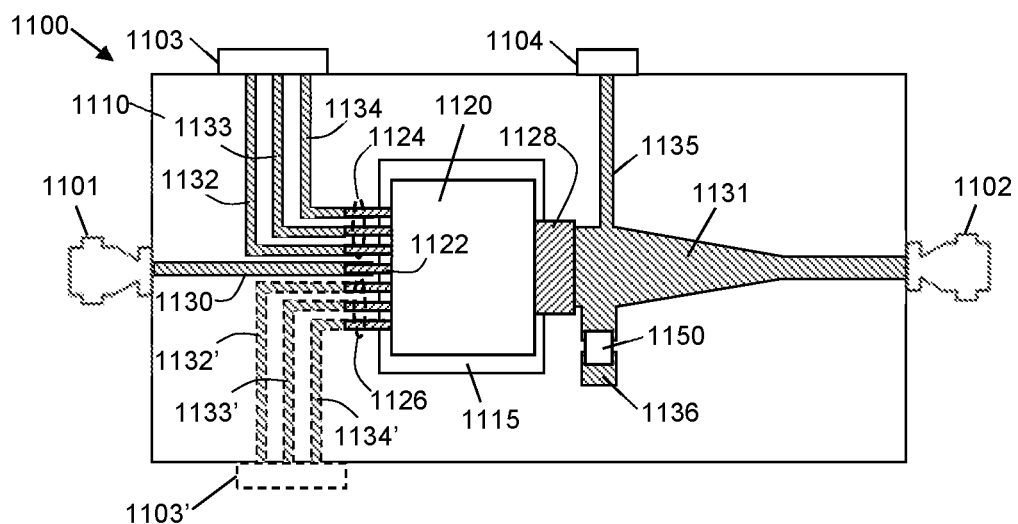
FIG. 11 is a top view of a packaged Doherty amplifier device coupled to a printed circuit board substrate, in accordance with an example embodiment.

Ultimately, Doherty amplifier device 1000 is incorporated into a larger electrical system (e.g., a power transmitter lineup in a cellular base station). For example, as illustrated in FIG. 11, a Doherty amplifier device 1120 (e.g., device 1000, FIG. 10) may be incorporated into amplifier system 1100.

Amplifier system 1100 includes a single-layer or multi-layer PCB 1110, and a plurality of elements coupled to the PCB 1110, in an embodiment. For example, the amplifier system 1100 may include a conductive coin 1115 (or other feature) that is exposed at top and bottom surfaces of the PCB 1110, and a Doherty amplifier device 1120 (e.g., device 1000, FIG. 10) connected to the conductive coin 1115. More specifically, the bottom surface (e.g., the bottom of flange 1030, FIG. 10) of the Doherty amplifier device 1120 may be physically and electrically connected to the top surface of the conductive coin 1115. The conductive coin 1115, in turn, may be electrically connected to system ground, and a bottom surface of the coin 1115 may be connected to a system heat sink. Accordingly, the conductive coin 1115 may function as a ground reference and a heat sink for the amplifier system 1100.

In a typical configuration, the amplifier system 1100 includes an input RF connector 1101 and an output RF connector 1102, which are configured, respectively, to receive an input RF signal from an RF signal source, and to produce an amplified output RF signal for transmission (e.g., via a cellular antenna coupled to connector 1102). One or more bias voltage connectors 1103, 1104 may be used to receive DC bias voltages from one or more voltage sources.

In addition, the amplifier system 1100 includes a plurality of conductive paths and features 1130-1136 that are electrically coupled between the connectors 1101-1103 and the Doherty amplifier device 1120. The conductive paths and features 1130-1136 may be formed from patterned portions of a top conductive layer, a bottom conductive layer, and/or interior conductive layer(s) (if included) of the PCB 1110.

A first conductive path 1130 electrically connects the input RF connector 1101 to an input RF signal lead 1122 (e.g., lead 1010, FIG. 10) of the Doherty amplifier device 1120. An input RF signal received by input RF connector 1101 is conveyed to the input RF signal lead 1122 through the first conductive path 1130 during operation of the system 1100. Similarly, a second conductive path 1131 electrically connects the output RF connector 1102 to an output RF signal lead 1128 (e.g., lead 1020, FIG. 10) of the Doherty amplifier device 1120. An amplified RF signal produced by the Doherty amplifier device 1120 is conveyed to the output RF connector 1102 through the second conductive path 1131 during operation of the system 1100.

Additional conductive paths 1132, 1133, 1134 electrically connect the bias voltage connector 1103 to a plurality of bias voltage leads 1124 (e.g., leads 1011, 1013, 1015, FIG. 10) on a first side of the Doherty amplifier device 1120 (e.g., left of bisection line 1001 of device 1000, FIG. 10). A plurality of drain and gate DC bias voltages are conveyed to the bias voltage leads 1124 through conductive paths 1132-1134 during operation of the system 1100. As explained in more detail previously in conjunction with FIG. 10, the bias circuit inputs (e.g., inputs 271, 271', 284, FIG. 2) of the Doherty IC (e.g., Doherty IC 200, FIG. 2) within Doherty amplifier device 1120 may be designed so that additional or alternative conductive paths 1132', 1133', 1134' and an additional or alternative bias voltage connector 1103' may additionally or alternatively be used to provide drain and gate bias voltages to bias voltage leads 1126 on a second side of the Doherty amplifier device 1120 (e.g., right of bisection line 1001 of device 1000, FIG. 10). On the output side, a conductive path 1135 electrically connects the bias voltage connector 1104 to the output RF signal lead 1128 (e.g., either directly or through path 1131, as shown in FIG. 11). A drain DC bias voltage for the final-stage amplifiers is conveyed to the output RF signal lead 1128 through bias voltage connector 1104, conductive path 1135, and output RF signal lead 1128 during operation of the system 1100.

According to an embodiment, amplifier system 1100 also may include a shunt inductor 1150, which is electrically coupled between the output RF signal lead 1128 and an additional conductive feature 1136. The shunt inductor 1150 may be a discrete inductor, for example, which has a first terminal coupled to the output RF signal lead 1128 (e.g., either directly or through path 1131, as shown in FIG. 11), and a second terminal coupled to the conductive feature 1136, which in turn is electrically coupled to system ground. The shunt inductor 1150 is configured to at least partially absorb the drain source capacitance of the peaking amplifier final-stage transistor(s) (e.g., drain-source capacitances, $C_{dsP}$, of the peaking amplifier final-stage FETs 250', 250", FIG. 2), in an embodiment. In an alternate embodiment, all or a portion of the shunt inductance provided by shunt inductor 1150 instead may be provided by designing an optimized conductive path 1135 between the bias voltage connector 1104 and the output RF signal lead 1128, in which case shunt inductor 1150 may be omitted. Although a shunt inductance for this purpose alternatively may be integrally formed within the device, as in the embodiment of FIG. 9 (e.g., shunt-L circuit 981), the relatively low inductance of the output wirebonds (e.g., wirebonds 1070, FIG. 10) enables the shunt inductance to be moved outside of the amplifier package, in accordance with various embodiments. This may enable the amplifier package size to be decreased, while also facilitating easier tuning of the system 1100, since the shunt inductor 1150 size can be modified without requiring a re-design of the Doherty amplifier device 1120.

Figure 12:
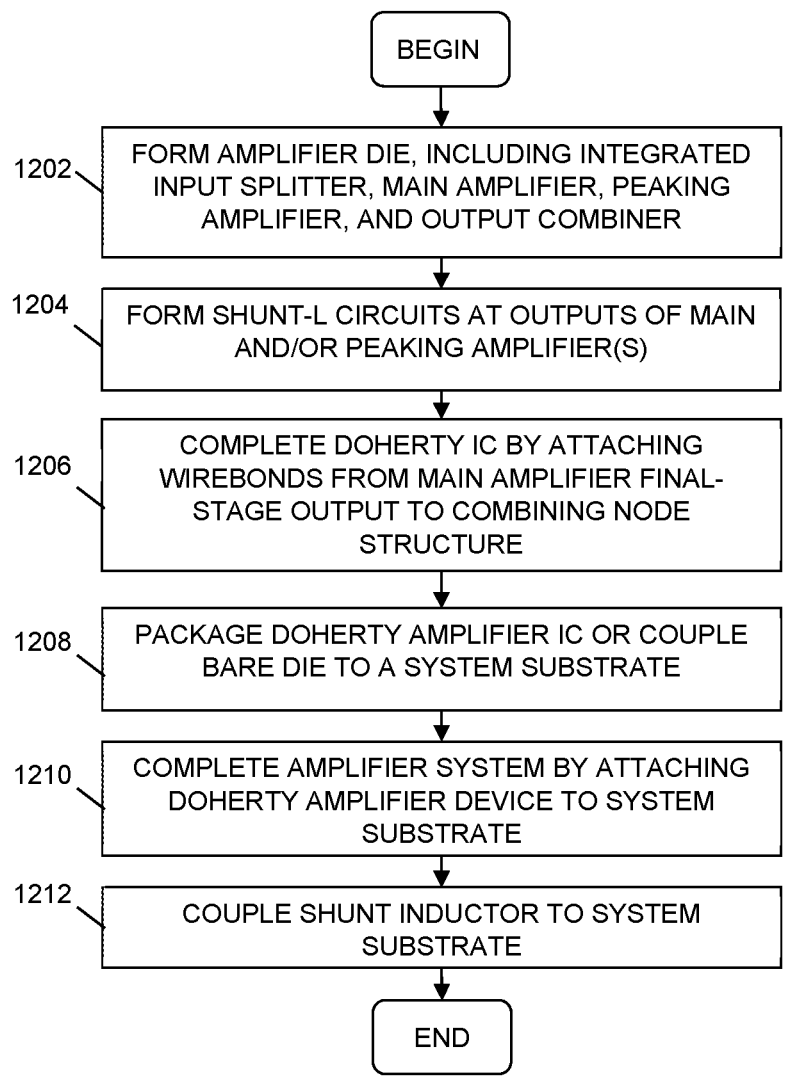
FIG. 12 is a flowchart of a method of making a Doherty power amplifier IC, and a packaged Doherty amplifier device, in accordance with an example embodiment.

FIG. 12 is a flowchart of a method of making a Doherty power amplifier IC (e.g., Doherty IC 200, 400, 500, 600, 700, 800, 900, FIGS. 2-9), a packaged Doherty amplifier device (e.g., device 1000, FIG. 10), and a Doherty amplifier system (e.g., system 1100, FIG. 11), in accordance with an example embodiment. The method may begin, in block 1202, by forming an amplifier die (e.g., die 201, 401, 501, 601, 701, 801, 901, FIGS. 2-9), which includes integrally-formed main amplifier transistors (e.g., FETs 226, 230, FIGS. 2-9), peaking amplifier transistors (e.g., FETs 246', 246", 250', 250", FIGS. 2-9), and a combining node structure (e.g., combining node structure 290, FIGS. 2-9). In addition, forming the amplifier die may include integrally-forming a power splitter (e.g., splitter 204, FIG. 2), matching networks (e.g., IMN 222, 242', 242", ISMN 228, 248', 248", FIG. 2), bias circuits (e.g., bias circuits 270, 270', 270", FIG. 2), VBW circuits (e.g., VBW circuits 278, 278', 278", 294, FIGS. 2-9), and/or other integrated components (e.g., capacitors 281, 484, 584, 684, 984, 987, and inductors 282', 282", 582', 582", FIGS. 2, 5). In alternate embodiments, some of the circuits and components in the previous sentence may be implemented on substrates that are distinct from the amplifier die.

In various embodiments, one or more shunt-L circuits (e.g., shunt-L circuits 180, 181, 280, 480, 580, 680, 780, 980, 981, FIGS. 1-9) are integrally formed in the amplifier die. As discussed in detail previously, the integrated shunt-L circuits may include a variety of combinations of integrated inductances and/or capacitances, wirebond arrays, and/or discrete inductors and/or capacitors, in various embodiments.

In block 1206, the Doherty amplifier IC (e.g., Doherty IC 200, 400, 500, 600, 700, 800, 900, FIGS. 2-9) is completed by connecting the output terminal (e.g., drain terminal 231, FIGS. 2-9) of the main amplifier final-stage transistor (e.g., FET 230, FIGS. 2-9) to the combining node structure (e.g., combining node structure 290, FIGS. 2-9). For example, the connection may be made with wirebonds (e.g., wirebonds 238, FIGS. 2-9) that have a predetermined length, height, and number to create a desired phase delay (e.g., 90 degrees) between the main and peaking amplifier outputs.

The Doherty amplifier IC (e.g., Doherty IC 200, 400, 500, 600, 700, 800, 900, FIGS. 2-9) may then be packaged in block 1208. As mentioned previously, the Doherty amplifier IC may be packaged in an overmolded or air-cavity power package. Alternatively, the Doherty amplifier IC may be attached as a bare die to a system substrate (e.g., a module or PCB substrate). When packaged in an overmolded package (e.g., package 1004, FIG. 10), the Doherty amplifier IC may be connected to a conductive flange of a leadframe, wirebonds (e.g., wirebonds 1050-1056, 1070, FIG. 10) may be coupled between input, output, and bias leads of the leadframe and appropriate bond pads of the Doherty amplifier IC, and the flange, leads, and Doherty amplifier IC may be encapsulated in molding compound. When packaged in an air-cavity package, an insulator frame may be attached to the top surface of a conductive flange, the Doherty amplifier IC may be connected to the top surface of the flange in the frame opening, input, output, and bias leads may be connected to the top surface of the insulator frame, wirebonds (e.g., wirebonds 1050-1056, 1070, FIG. 10) may be coupled between the input, output, and bias leads and appropriate bond pads of the Doherty amplifier IC, and a cap may be applied over the flange, insulator frame, leads, wirebonds, and Doherty amplifier IC to encase the Doherty amplifier IC in an air cavity.

In block 1210, the amplifier system (e.g., system 1100, FIG. 11) may be completed by attaching the Doherty amplifier device (e.g., device 1000, FIG. 10) (or in some embodiments the bare die) to a system substrate, such as a PCB (e.g., PCB 1110, FIG. 11). More specifically, the bottom surface of the Doherty amplifier device may be connected to a conductive coin (e.g., coin 1115, FIG. 11) to provide a ground reference and heat sink to the device, and the device's input, output, and bias leads may be connected to corresponding conductive paths (e.g., paths 1130-1134, FIG. 11) of the system substrate.

According to an embodiment, additional components may be coupled to the system substrate (e.g., PCB 1110, FIG. 11), in block 1212, to complete the amplifier system. For example, as described previously, a discrete inductor (e.g., inductor 1150, FIG. 11) may be coupled between the Doherty amplifier device's output lead (e.g., output lead 1128, FIG. 11) and a ground reference by coupling the inductor to conductive features (e.g., path 1131 and feature 1136, FIG. 11) of the system substrate. The method may then end.

An embodiment of a multiple-path amplifier includes a semiconductor die, an RF signal input terminal, a combining node structure integrally formed with the semiconductor die, first and second amplifiers integrally formed with the semiconductor die, and a shunt circuit electrically connected between an output of the first amplifier and a ground reference node. Inputs of the first and second amplifier are electrically coupled to the RF signal input terminal, and outputs of the first and second amplifier are electrically coupled to the combining node structure. The shunt circuit includes a shunt inductance and a shunt capacitance coupled in series between the output of the first amplifier and the ground reference node, and the shunt capacitance has a first terminal coupled to the shunt inductance, and a second terminal coupled to the ground reference node.

According to a further embodiment, the multi-path amplifier further includes a second inductance electrically coupling the output of the first amplifier and the combining node structure, where the second inductance comprises a plurality of wirebonds. According to another further embodiment, the shunt inductance includes one or more wirebonds coupled between the output of the first amplifier and the first terminal of the shunt capacitance. According to yet another further embodiment, the shunt inductance further includes one or more inductors integrally formed with the semiconductor die. According to yet another further embodiment, the one or more inductors integrally formed with the semiconductor die are coupled in series with the one or more wirebonds between the output of the first amplifier and the first terminal of the shunt capacitance. According to yet another further embodiment, the shunt inductance includes one or more discrete inductors coupled to the semiconductor die and electrically coupled between the output of the first amplifier and the first terminal of the shunt capacitance. According to yet another further embodiment, the shunt capacitance includes one or more capacitors selected from one or more capacitors integrally formed with the semiconductor die and one or more discrete capacitors. According to yet another further embodiment, the combining node structure includes an elongated conductive bondpad that is exposed at a top surface of semiconductor die. According to yet another further embodiment, the output of the second amplifier is connected to the combining node structure with a conductive path having a negligible phase delay. According to yet another further embodiment, a conductive path between the output of the first amplifier and the output of the second amplifier is characterized by a phase delay substantially equal to 90 degrees at a center frequency of operation of the multi-path amplifier. According to yet another further embodiment, the first amplifier includes a first field effect transistor (FET) coupled between the RF signal input terminal and the combining node structure, and the second amplifier includes a second FET coupled between the RF signal input terminal and the combining node structure. According to yet another further embodiment, the semiconductor die comprises a base semiconductor substrate having bulk resistivity in a range of about 1000 ohm-cm to about 100,000 ohm-cm or greater. An embodiment of a Doherty amplifier integrated circuit includes a semiconductor die, an RF signal input terminal, a combining node structure integrally formed with the semiconductor die, main and peaking amplifiers integrally formed with the semiconductor die, and a shunt circuit electrically connected between an output of the main amplifier and a ground reference node.

The combining node structure includes a conductive bondpad that is exposed at a top surface of semiconductor die. Inputs of the main and peaking amplifiers are electrically coupled to the RF signal input terminal, and outputs of the main and peaking amplifiers are electrically coupled to the combining node structure. The shunt circuit includes a shunt inductance and a shunt capacitance coupled in series between the output of the main amplifier and the ground reference node. The shunt capacitance has a first terminal coupled to the shunt inductance, and a second terminal coupled to the ground reference node According to a further embodiment, the Doherty amplifier integrated circuit also includes a plurality of wirebonds electrically connecting the output of the main amplifier and the combining node structure. According to another further embodiment, the shunt inductance includes one or more wirebonds coupled between the output of the main amplifier and the first terminal of the shunt capacitance. According to yet another further embodiment, the shunt inductance further includes one or more inductors integrally formed with the semiconductor die and coupled in series with the one or more wirebonds between the output of the main amplifier and the first terminal of the shunt capacitance. According to yet another further embodiment, the shunt inductance includes one or more inductors integrally formed with the semiconductor die and coupled between the output of the main amplifier and the first terminal of the shunt capacitance. According to yet another further embodiment, the main amplifier includes a first input and a first FET with a first drain terminal that is electrically coupled to the combining node structure, the peaking amplifier is divided into first and second peaking amplifier portions that are physically located on opposite sides of the main amplifier, the first peaking amplifier portion includes a second input and a second FET with a second drain terminal that is electrically coupled to the combining node structure, and the second peaking amplifier portion includes a third input and a third FET with a third drain terminal that is electrically coupled to the combining node structure, and the combining node structure has a length that extends from an outside end of the second drain terminal of the second FET to an outside end of the third drain terminal of the third FET. According to yet another further embodiment, the second drain terminal and the third drain terminal each are connected to the combining node structure with a conductive path having a negligible phase delay. According to yet another further embodiment, the Doherty amplifier integrated circuit further includes an integrated signal splitter electrically coupled between the RF signal input terminal, the input of the main amplifier, and the input of the peaking amplifier, where the integrated signal splitter is configured to divide an input RF signal received at the RF signal input terminal into multiple RF signals for amplification by the main and peaking amplifiers.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or detailed description.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A multiple-path amplifier comprising:
   a semiconductor die comprising a base semiconductor substrate formed from a semiconductor material;
   a radio frequency (RF) signal input terminal;
   a combining node structure integrally formed in the semiconductor die;
   a first amplifier integrally formed in the semiconductor die, wherein an input of the first amplifier is electrically coupled to the RF signal input terminal, and an output of the first amplifier is electrically coupled to the combining node structure;
   a shunt circuit electrically connected between the output of the first amplifier and a ground reference node, wherein the shunt circuit includes a shunt inductance and a shunt capacitance coupled in series between the output of the first amplifier and the ground reference node, wherein the shunt capacitance has a first terminal coupled to the shunt inductance, and a second terminal coupled to the ground reference node; and a second amplifier integrally formed in the semiconductor die, wherein an input of the second amplifier is electrically coupled to the RF signal input terminal, and an output of the second amplifier is electrically coupled to the combining node structure.

2. The multi-path amplifier of claim 1, further comprising:
a second inductance electrically coupling the output of the first amplifier and the combining node structure, wherein the second inductance comprises a plurality of wirebonds.

3. The multi-path amplifier of claim 1, wherein the shunt inductance comprises:
one or more wirebonds coupled between the output of the first amplifier and the first terminal of the shunt capacitance.

4. The multi-path amplifier of claim 3, wherein the shunt inductance further comprises:
one or more inductors integrally formed in the semiconductor die and coupled in series with the one or more wirebonds between the output of the first amplifier and the first terminal of the shunt capacitance.

5. The multi-path amplifier of claim 1, wherein the shunt inductance comprises:
one or more inductors integrally formed in the semiconductor die and coupled between the output of the first amplifier and the first terminal of the shunt capacitance.

6. The multi-path amplifier of claim 1, wherein the shunt inductance comprises:
one or more discrete inductors coupled to the semiconductor die and electrically coupled between the output of the first amplifier and the first terminal of the shunt capacitance.

7. The multi-path amplifier of claim 1, wherein the shunt capacitance comprises one or more capacitors selected from a group consisting of one or more capacitors integrally formed in the semiconductor die and one or more discrete capacitors.

8. The multi-path amplifier of claim 1, wherein the output of the second amplifier is connected to the combining node structure with a conductive path having a phase delay of 10 degrees or less.

9. The multi-path amplifier of claim 1, wherein a conductive path between the output of the first amplifier and the output of the second amplifier is characterized by a phase delay equal to 90 degrees at a center frequency of operation of the multi-path amplifier.

10. The multi-path amplifier of claim 1, wherein:
the first amplifier comprises a first field effect transistor (FET) coupled between the RF signal input terminal and the combining node structure; and
the second amplifier comprises a second FET coupled between the RF signal input terminal and the combining node structure.

11. The multi-path amplifier of claim 1, wherein the semiconductor die comprises a base semiconductor substrate having bulk resistivity in a range of about 1000 ohm-centimeter (cm) to about 100,000 ohm-cm or greater.

12. A multiple-path amplifier comprising:
a semiconductor die comprising a base semiconductor substrate formed from a semiconductor material;
a radio frequency (RF) signal input terminal;
a combining node structure integrally formed in the semiconductor die, wherein the combining node structure comprises an elongated conductive bondpad that is exposed at a top surface of the semiconductor die;
a first amplifier integrally formed in the semiconductor die, wherein an input of the first amplifier is electrically coupled to the RF signal input terminal, and an output of the first amplifier is electrically coupled to the combining node structure;
a shunt circuit electrically connected between the output of the first amplifier and a ground reference node, wherein the shunt circuit includes a shunt inductance and a shunt capacitance coupled in series between the output of the first amplifier and the ground reference node, wherein the shunt capacitance has a first terminal coupled to the shunt inductance, and a second terminal coupled to the ground reference node; and
a second amplifier integrally formed in the semiconductor die, wherein an input of the second amplifier is electrically coupled to the RF signal input terminal, and an output of the second amplifier is electrically coupled to the combining node structure.

13. A Doherty amplifier integrated circuit comprising:
a semiconductor die comprising a base semiconductor substrate formed from a semiconductor material;
a radio frequency (RF) signal input terminal;
a combining node structure integrally formed in the semiconductor die and comprising a conductive bondpad that is exposed at a top surface of semiconductor die;
a main amplifier integrally formed in the semiconductor die, wherein an input of the main amplifier is electrically coupled to the RF signal input terminal, and an output of the main amplifier is electrically coupled to the combining node structure;
a shunt circuit electrically connected between the output of the main amplifier and a ground reference node, wherein the shunt circuit includes a shunt inductance and a shunt capacitance coupled in series between the output of the main amplifier and the ground reference node, wherein the shunt capacitance has a first terminal coupled to the shunt inductance, and a second terminal coupled to the ground reference node; and
a peaking amplifier integrally formed in the semiconductor die, wherein an input of the peaking amplifier is electrically coupled to the RF signal input terminal, and an output of the peaking amplifier is electrically coupled to the combining node structure.

14. The Doherty amplifier integrated circuit of claim 13, further comprising:
a plurality of wirebonds electrically connecting the output of the main amplifier and the combining node structure.

15. The Doherty amplifier integrated circuit of claim 13, wherein the shunt inductance comprises:
one or more wirebonds coupled between the output of the main amplifier and the first terminal of the shunt capacitance.

16. The Doherty amplifier integrated circuit of claim 15, wherein the shunt inductance further comprises:
one or more inductors integrally formed in the semiconductor die and coupled in series with the one or more wirebonds between the output of the main amplifier and the first terminal of the shunt capacitance.

17. The Doherty amplifier integrated circuit of claim 13, wherein the shunt inductance comprises:
one or more inductors integrally formed in the semiconductor die and coupled between the output of the main amplifier and the first terminal of the shunt capacitance.

18. The Doherty amplifier integrated circuit of claim 13, wherein:
the main amplifier includes a first input and a first field effect transistor (FET) with a first drain terminal that is electrically coupled to the combining node structure;

the peaking amplifier is divided into first and second peaking amplifier portions that are physically located on opposite sides of the main amplifier, wherein the first peaking amplifier portion includes a second input and a second FET with a second drain terminal that is electrically coupled to the combining node structure, and the second peaking amplifier portion includes a third input and a third FET with a third drain terminal that is electrically coupled to the combining node structure, and the combining node structure has a length that extends from an outside end of the second drain terminal of the second FET to an outside end of the third drain terminal of the third FET.

19. The Doherty amplifier integrated circuit of claim 18, wherein the second drain terminal and the third drain terminal each are connected to the combining node structure with a conductive path having a negligible phase delay.

20. The Doherty amplifier integrated circuit of claim 13, further comprising:

an integrated signal splitter electrically coupled between the RF signal input terminal, the input of the main amplifier, and the input of the peaking amplifier, wherein the integrated signal splitter is configured to divide an input RF signal received at the RF signal input terminal into multiple RF signals for amplification by the main and peaking amplifiers.

* * * * *